US010686122B2

United States Patent
Park et al.

(10) Patent No.: US 10,686,122 B2
(45) Date of Patent: Jun. 16, 2020

(54) VARIABLE RESISTANCE MEMORY DEVICE

(71) Applicant: Samsung Electronics Co., Ltd., Suwon-si, Gyeonggi-do (KR)

(72) Inventors: Jung-hwan Park, Seoul (KR); Ju-hyun Kim, Yongin-si (KR); Se-chung Oh, Yongin-si (KR); Dong-kyu Lee, Suwon-si (KR); Jung-min Lee, Gwangmyeong-si (KR); Kyung-il Hong, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/983,255

(22) Filed: May 18, 2018

(65) Prior Publication Data
US 2019/0131516 A1    May 2, 2019

(30) Foreign Application Priority Data

Nov. 1, 2017    (KR) .......................... 10-2017-0144753

(51) Int. Cl.
H01L 43/02    (2006.01)
H01L 43/12    (2006.01)
H01L 23/532    (2006.01)
H01L 27/22    (2006.01)
H01L 23/538    (2006.01)
H01L 45/00    (2006.01)
(Continued)

(52) U.S. Cl.
CPC .......... *H01L 43/02* (2013.01); *G11C 11/1675* (2013.01); *H01L 23/5386* (2013.01); *H01L 23/53228* (2013.01); *H01L 27/222* (2013.01); *H01L 27/228* (2013.01); *H01L 27/2436* (2013.01); *H01L 27/2463* (2013.01); *H01L 43/12* (2013.01); *H01L 45/08* (2013.01); *H01L 45/1233* (2013.01); *H01L 45/1253* (2013.01); *H01L 45/146* (2013.01); *H01L 45/147* (2013.01); *H01L 45/1675* (2013.01); *G11C 11/1655* (2013.01); *G11C 11/1657* (2013.01); *G11C 13/0004* (2013.01)

(58) Field of Classification Search
CPC ......... H01L 43/02; H01L 43/12; H01L 23/53; H01L 27/22; H01L 45/08
USPC ....................................................... 257/421
See application file for complete search history.

(56) References Cited

U.S. PATENT DOCUMENTS 8,198,730 B2    6/2012  Tagami et al.
9,059,023 B2    6/2015  Jang et al.
(Continued)

FOREIGN PATENT DOCUMENTS

JP            5413563 B2    2/2014
JP      WO2014030393 A1   7/2016
(Continued)

*Primary Examiner* — Fazli Erdem
(74) *Attorney, Agent, or Firm* — Harness, Dickey & Pierce, P.L.C.

(57) ABSTRACT

A variable resistance memory device includes a metal interconnection layer on a substrate, an interlayer insulating layer on the metal interconnection layer and defining a contact hole for exposing a portion of the metal interconnection layer, a barrier metal layer including a plurality of sub-barrier metal layers inside the contact hole, a plug metal layer on the barrier metal layer and burying the contact hole, and a variable resistance structure on the barrier metal layer and the plug metal layer.

19 Claims, 18 Drawing Sheets

(51) Int. Cl.
*H01L 27/24* (2006.01)
*G11C 11/16* (2006.01)
*G11C 13/00* (2006.01)

(56) References Cited

U.S. PATENT DOCUMENTS

| | | | |
|---|---|---|---|
| 9,362,228 B2 | 5/2016 | Chae et al. | |
| 9,502,466 B1* | 11/2016 | Chuang | H01L 27/222 |
| 2004/0124537 A1* | 7/2004 | Takayama | H01L 21/2855 |
| | | | 257/758 |
| 2006/0081961 A1* | 4/2006 | Tanaka | H01L 27/112 |
| | | | 257/536 |
| 2006/0292816 A1* | 12/2006 | Mikawa | H01L 28/55 |
| | | | 438/396 |
| 2008/0157205 A1 | 7/2008 | Sung et al. | |
| 2008/0296772 A1* | 12/2008 | Nakao | H01L 23/5223 |
| | | | 257/761 |
| 2013/0112935 A1* | 5/2013 | Himeno | H01L 45/1253 |
| | | | 257/4 |
| 2013/0140515 A1* | 6/2013 | Kawashima | H01L 45/085 |
| | | | 257/4 |
| 2013/0280859 A1 | 10/2013 | Kim et al. | |
| 2014/0063913 A1* | 3/2014 | Kawashima | G11C 13/0007 |
| | | | 365/148 |
| 2014/0098595 A1* | 4/2014 | Kawashima | H01L 27/101 |
| | | | 365/148 |
| 2014/0327056 A1* | 11/2014 | Park | H01L 29/78 |
| | | | 257/288 |
| 2015/0171142 A1* | 6/2015 | Kawashima | H01L 27/2463 |
| | | | 257/4 |
| 2015/0221865 A1 | 8/2015 | Tada et al. | |
| 2015/0262864 A1 | 9/2015 | Okamoto et al. | |
| 2016/0155933 A1* | 6/2016 | Kim | H01L 43/08 |
| | | | 711/104 |
| 2017/0069832 A1* | 3/2017 | Kim | H01L 43/08 |
| 2017/0141159 A1* | 5/2017 | Kim | G06F 3/061 |
| 2017/0192678 A1* | 7/2017 | Kim | H01L 43/12 |
| 2017/0194378 A1* | 7/2017 | Kim | G06F 12/084 |

FOREIGN PATENT DOCUMENTS

| | | |
|---|---|---|
| KR | 10-0625816 B1 | 9/2006 |
| KR | 10-0844958 B1 | 7/2008 |
| KR | 10-2012-0077288 A | 7/2012 |
| KR | 10-2017-0055716 A | 5/2017 |

* cited by examiner

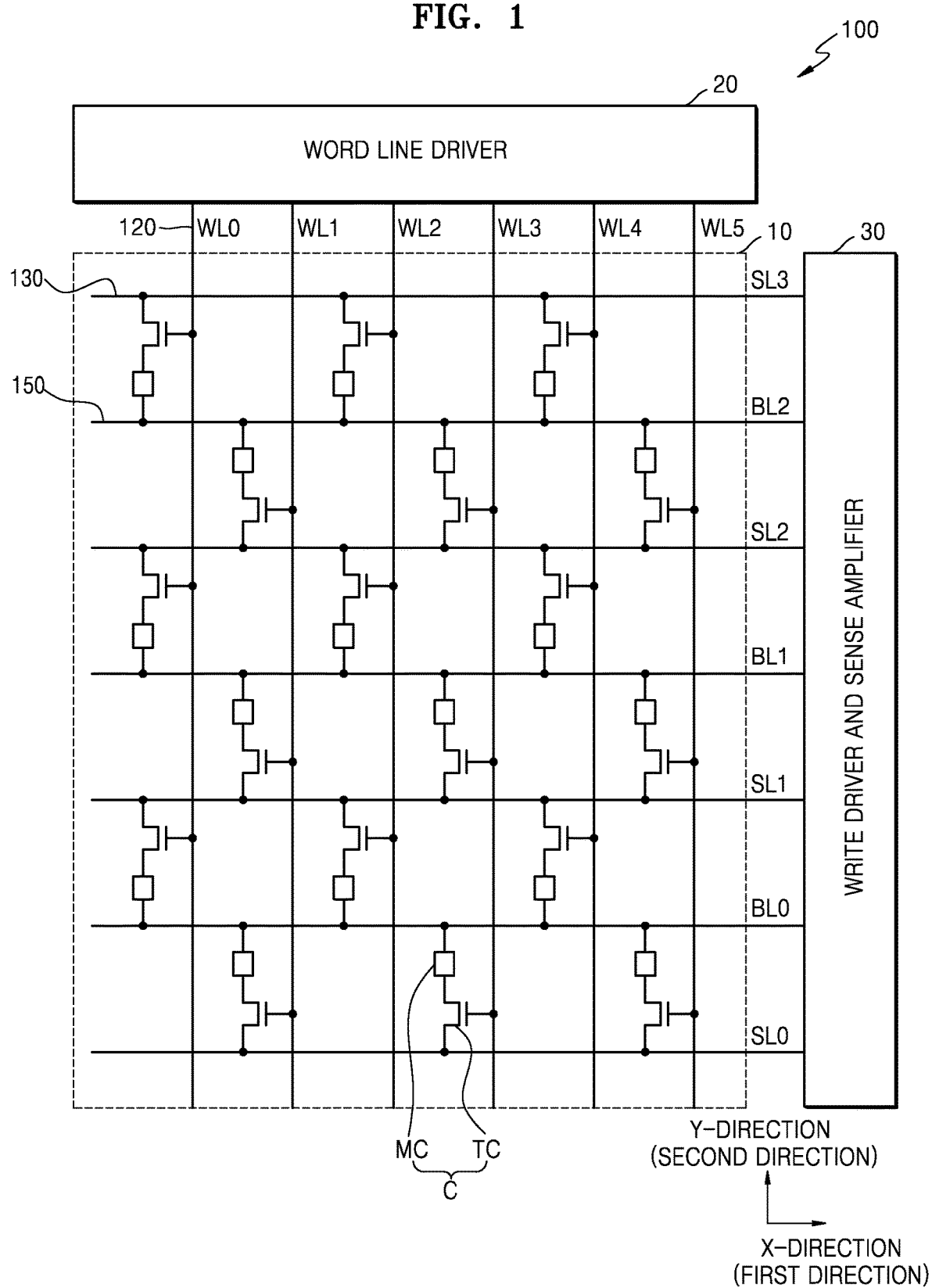

VARIABLE RESISTANCE MEMORY DEVICE

CROSS-REFERENCE TO RELATED APPLICATION

This application claims the benefit of Korean Patent Application No. 10-2017-0144753, filed on Nov. 1, 2017, in the Korean Intellectual Property Office, the disclosure of which is incorporated herein in its entirety by reference.

BACKGROUND

Inventive concepts relate to a memory device, and more particularly, to a variable resistance memory device including a variable resistance layer.

Variable resistance memory devices use current transmission characteristics of a variable resistance layer according to an applied voltage. Variable resistance memory devices may include a plurality of metal interconnection layers on a substrate. The variable resistance layer may be formed on the plurality of metal interconnection layers. In variable resistance memory devices, metal interconnection layers may be required to be electrically connected to the variable resistance layer without damage to the metal interconnection layers or the variable resistance layer.

SUMMARY

Inventive concepts provide a variable resistance memory device in which a metal interconnection layer may be electrically connected to a variable resistance layer with reliability and without damage to the metal interconnection layer or the variable resistance layer.

According to an aspect of inventive concepts, a variable resistance memory device includes a substrate, a metal interconnection layer on the substrate, an interlayer insulating layer on the metal interconnection layer and defining a contact hole for exposing a portion of the metal interconnection layer, a barrier metal layer including a plurality of sub-barrier metal layers inside the contact hole, a plug metal layer on the barrier metal layer and the plug metal layer burying the contact hole, and a variable resistance structure on the barrier metal layer and the plug metal layer.

According to another aspect of inventive concepts, a variable resistance memory device includes a substrate, a metal interconnection layer on the substrate, an interlayer insulating layer on the metal interconnection layer and defining a contact hole for exposing a portion of the metal interconnection layer, a first barrier metal layer on the metal interconnection layer and covering a bottom of the contact hole and covering an inner wall of the contact hole, a second barrier metal layer on the first barrier metal layer, a plug metal layer on the second barrier metal layer, and a variable resistance structure. The plug metal layer may bury the contact hole. The first barrier metal layer, the second barrier metal layer, and the plug metal layer may form a contact plug having a first width. The variable resistance structure may be on the first barrier metal layer, the second barrier metal layer, and the plug metal layer. The variable resistance structure may have a second width.

According to another aspect of inventive concepts, a variable resistance memory device may include a plurality of word lines, a plurality of source lines, a metal interconnection layer, a contact plug, a plurality of bit lines, and a plurality of memory cells. The plurality of word lines may be arranged parallel to one another along a first direction and may be spaced apart from one another. The plurality of source lines may be arranged parallel to one another along a second direction perpendicular to the first direction and may be spaced apart from one another. The plurality of bit lines may be arranged on the plurality of source lines, may be parallel to one another along the second direction, and may be spaced apart from one another. The plurality of memory cells may be connected between the plurality of source lines and the plurality of bit lines. Each of the plurality of memory cells may include a variable resistance structure that includes a variable resistance layer and a cell transistor. The cell transistor may include a source and a drain. The source or the drain of the cell transistor in a corresponding one of the plurality of memory cells may be connected to the metal interconnection layer. The variable resistance structure may be connected to the metal interconnection layer via the contact plug including the plurality of barrier metal layers.

BRIEF DESCRIPTION OF THE DRAWINGS

Embodiments of inventive concepts will be more clearly understood from the following detailed description taken in conjunction with the accompanying drawings in which:

FIG. 1 is a circuit diagram of a variable resistance memory device according to some embodiments of inventive concepts;

DETAILED DESCRIPTION

Figure 2A:
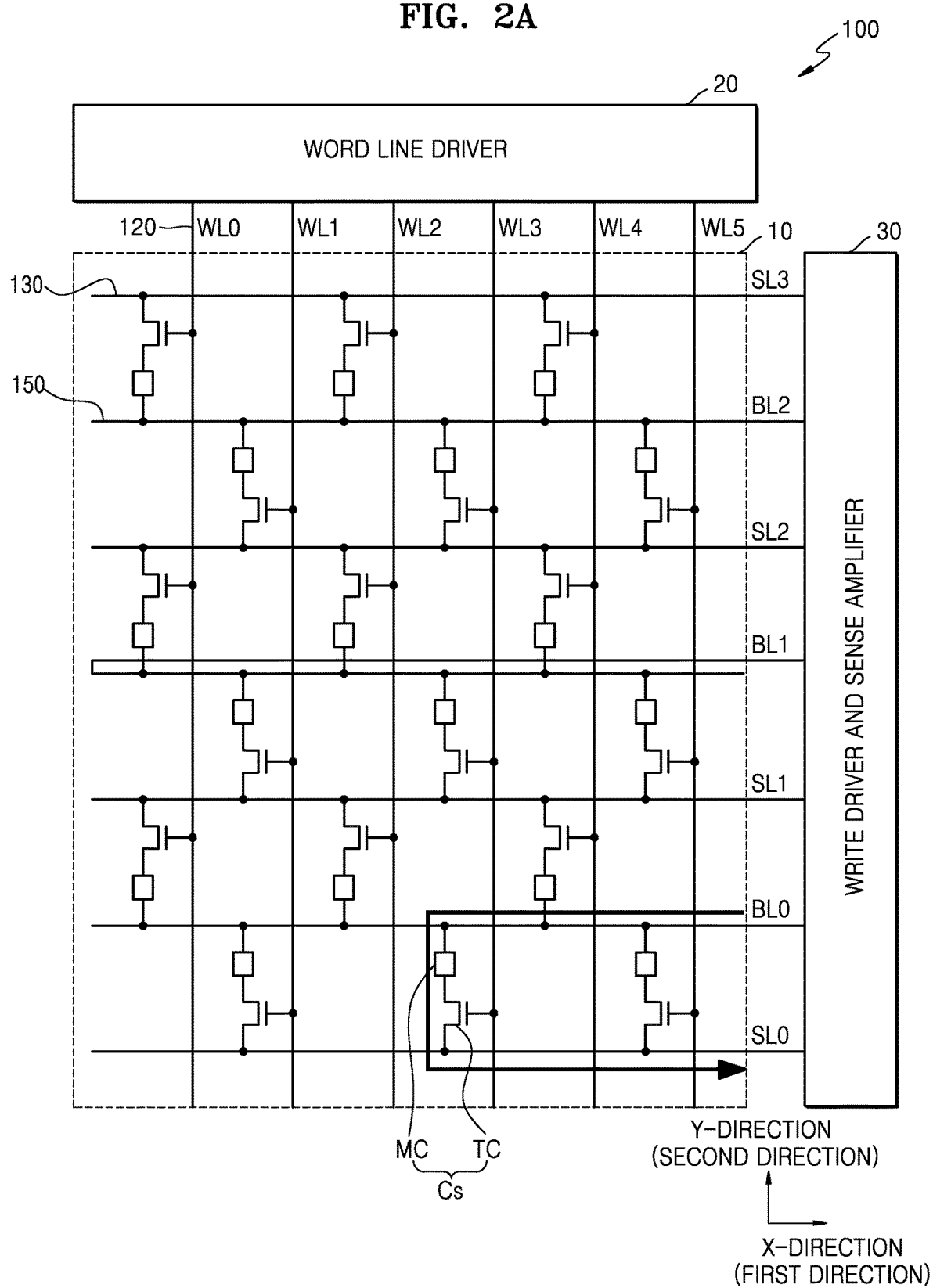
FIGS. 2A and 2B are conceptual views for explaining a principle of recording "1" and "0" data in the variable resistance memory device of FIG. 1.

Hereinafter, example embodiments of inventive concepts will be described in detail with reference to the attached drawings. The following embodiments may be implemented with only one embodiment or a combination of one or more embodiments. Thus, the technical spirit of inventive concepts is not limited to one embodiment.

FIG. 1 is a circuit diagram of a variable resistance memory device according to some embodiments of inventive concepts.

In detail, a variable resistance memory device 100 may include a memory cell array 10, a word line driver region 20, and a write driver and sense amplifier region 30. The memory cell array 10 may include a plurality of memory cells C arranged in a matrix form. Each of the memory cells C may include a cell transistor TC and a cell memory MC. The cell memory MC may include a variable resistance layer and may alternatively be referred to as a variable resistance layer.

The memory cell array 10 may include a plurality of word lines WL0 to WL5 (120), a plurality of source lines SL0 to SL3 (130), and a plurality of bit lines BL0 to BL2 (150). In FIG. 1, the number of the word lines WL0 to WL5 (120), the number of the source lines SL0 to SL3 (130), and the number of the bit lines BL0 to BL2 (150) are just examples for convenience and may be different than the respective numbers shown in FIG. 1. The memory cells C illustrated in FIG. 1 may be electrically connected to a word line WL3 among the word lines WL0 to WL5 (120), a source line SL0 among the source lines SL0 to SL3 (130), and a bit line BL0 among the bit lines BL0 to BL2 (150).

The cell memory MC may include a material layer having a varying resistance value. The cell memory MC may have a resistance value corresponding to a data value. For example, the variable resistance layer of the cell memory MC may have a lower resistance value than a desired (and/or alternatively predetermined) reference resistance value, thereby storing "0" data. Contrary to this, the variable resistance layer of the cell memory MC may have a higher resistance value than the desired (and/or alternatively predetermined) reference resistance value, thereby storing data "1". Here, "0" and "1" data according to resistance values are examples and may be reversed.

According to some embodiments, the cell memory MC may include a magnetic substance. The cell memory MC may include a magnetic tunnel junction (MTJ) device (or a magnetoresistive device). The cell memory MC may perform a memory function using a spin transfer torque (STT) phenomenon in which a magnetization direction of the magnetic substance is switched by an input current. In this case, the variable resistance memory device 100 may be magnetic random access memory (MRAM).

According to some embodiments, the cell memory MC may have a phase-change material layer having a crystalline state or an amorphous state that varies according to currents flowing between the source lines SL0 to SL3 (130) and the bit lines BL0 to BL2 (150). In this case, the variable resistance memory device 100 may be phase-change RAM (PRAM). In other embodiments, the cell memory MC may have a material layer having an electrical resistance that varies due to oxygen vacancy or oxygen movement. In this case, the variable resistance memory device 100 may be resistive RAM (ReRAM).

The cell transistor TC may be turned on or off according to voltages applied to the word lines WL0 to WL5 (120). The cell transistor TC may be referred to as a switching device. For example, the cell transistor TC may be a metal oxide semiconductor (MOS) transistor. In FIG. 1, when the cell transistor TC is turned on, currents may flow between the bit line BL0, the cell memory MC, and the source line SL0, and data may be written to/read from the cell memory MC.

The word lines WL0 to WL5 (120) may be arranged parallel to one another while being spaced in a first direction (X-direction) apart from one another by a desired (and/or alternatively predetermined) distance, and may respectively extend in a second direction (Y-direction). Each of the word lines WL0 to WL5 (120) may be driven by a word line driver within the word line driver region 20. The word line driver region 20 may be in the second direction (Y-direction) of the memory cell array 10.

In order to select one WL3 from among the word lines WL0 to WL5 (120), the word line driver may output a voltage used to turn on the cell transistor TC to the corresponding word line WL3. The second direction (Y-direction) may be different from the first direction (X-direction). For example, the second direction (Y-direction) may meet the first direction (X-direction) at right angle.

The source lines SL0 to SL3 (130) may be arranged parallel to one another along the second direction (Y-direction) to be spaced apart from one another by a desired (and/or alternatively predetermined) distance and may extend in the first direction (X-direction). The bit lines BL0 to BL2 (150) may be arranged parallel to one another along the second direction (Y-direction) to be spaced apart from one another by a desired (and/or alternatively predetermined) distance, like in the source lines SL0 to SL3 (130), and may extend to one another along the first direction (X-direction).

The source lines SL0 to SL3 (130) may be connected to sources or drains of the memory cells C. The bit lines BL0 to BL2 (150) may be connected to one end of the cell memory MC. The cell memory MC may be connected to the sources or drains of the memory cells C. The source lines SL0 to SL3 (130) and the bit lines BL1 to BL2 (150) may be connected to the write driver and sense amplifier region 30 in the first direction of the memory cell array 10.

A plurality of source line drivers for driving the source lines SL0 to SL3 (130) and a plurality of bit line drivers for driving the bit lines BL0 to BL2 (150) may be arranged in the write driver and sense amplifier region 30. Also, sense amplifiers that are electrically connected to the bit lines BL0 to BL2 may be arranged in the write driver and sense amplifier region 30.

Various embodiments of inventive concepts will be described based on the case where the variable resistance memory device 100 is MRAM. In the MRAM, currents need to flow through an MTJ device in both directions so that "0" and "1" data may be stored in the MTJ device (or a magnetoresistive device) that is a memory device included in the MRAM.

That is, a direction of currents that flow through the MTJ device when "0" data is recorded, is required to be opposite to a direction of currents that flow through the MTJ device when "1" data is recorded. In order to form a structure in which opposite currents flow through the MTJ device, there are bit lines and source lines in the MRAM. An MTJ device of memory cells are connected in series to a cell transistor between bit lines and source lines, and a potential difference between the bit lines and the source lines may be changed so as to select a direction of currents that flow through the MTJ device of the memory cells. FIG. 1 illustrates a circuit diagram of a memory cell array according to some embodiments. However, this is just an example, and embodiments are not limited to the circuit diagram of FIG. 1.

Figure 2B:
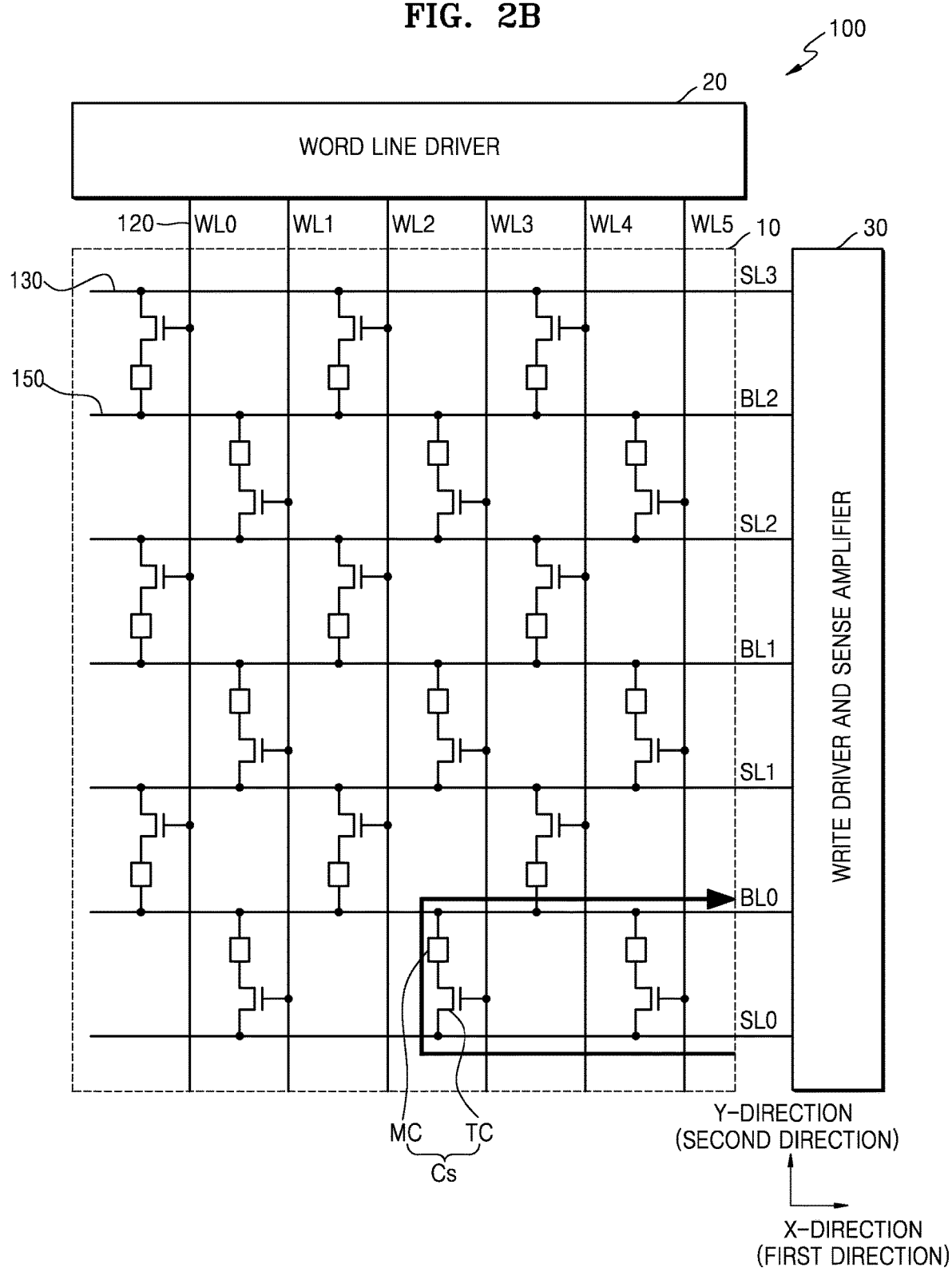

FIGS. 2A and 2B are conceptual views for explaining a principle of recording "1" and "0" data in the variable resistance memory device of FIG. 1.

Referring to FIG. 2A, when "1" data is recorded on a selected memory cell Cs, if a fourth word line WL3 and a first bit line BL0 (or a first source line SL0) are selected, the selected memory cell Cs may be solely determined.

When an appropriate turn-on voltage is applied to the fourth word line WL3, a high voltage is applied to the first bit line BL0 and a low voltage is applied to the first source line SL0, a current path indicated by an arrow may be generated, and "1" data may be recorded on a cell memory MC of the selected memory cell Cs.

Here, the high voltage applied to the first bit line BL0 may be 1.2V, for example, and the low voltage applied to the first source line SL0 may be 0V, for example. However, values of the high voltage and the low voltage are example values, and the high voltage applied to the first bit line BL0 and the low voltage applied to the first source line SL0 are not limited to the above values.

Referring to FIG. 2B, when "0" data is recorded on the selected memory cell Cs, if the fourth word line WL3 and the first bit line BL0 (or the first source line SL0) are selected in the same way, the selected memory cell Cs may be solely determined.

When an appropriate turn-on voltage is applied to the fourth word line WL3, a low voltage is applied to the first bit line BL0 and a high voltage is applied to the first source line SL0, a current path indicated by an arrow may be generated, and "0" data may be recorded on the cell memory MC of the selected memory cell Cs.

Here, the low voltage applied to the first bit line BL0 may be 0V, for example, and the high voltage applied to the first source line SL0 may be 1.2V, for example. However, values of the high voltage and the low voltage are example values, and the high voltage applied to the first bit line BL0 and the low voltage applied to the first source line SL0 are not limited to the above values. Voltages applied to the first bit line BL0 and the first source line SL0 may be changed so that "1" data may be recorded on the cell memory MC of the selected memory cell Cs. Thus, according to the current embodiment, data may be recorded on the cell memory MC with a low operating voltage of about 1.2V.

FIG. 2A illustrates a current flow for recording "1" data on the selected memory cell Cs, and FIG. 2B illustrates a current flow for recording "0" data on the selected memory cell Cs. However, these are just examples, and "0" data may be recorded on the selected memory cell Cs due to the current flow of FIG. 2A, and "1" data may be recorded on the selected memory cell Cs due to the current flow of FIG. 2B.

Figure 3:
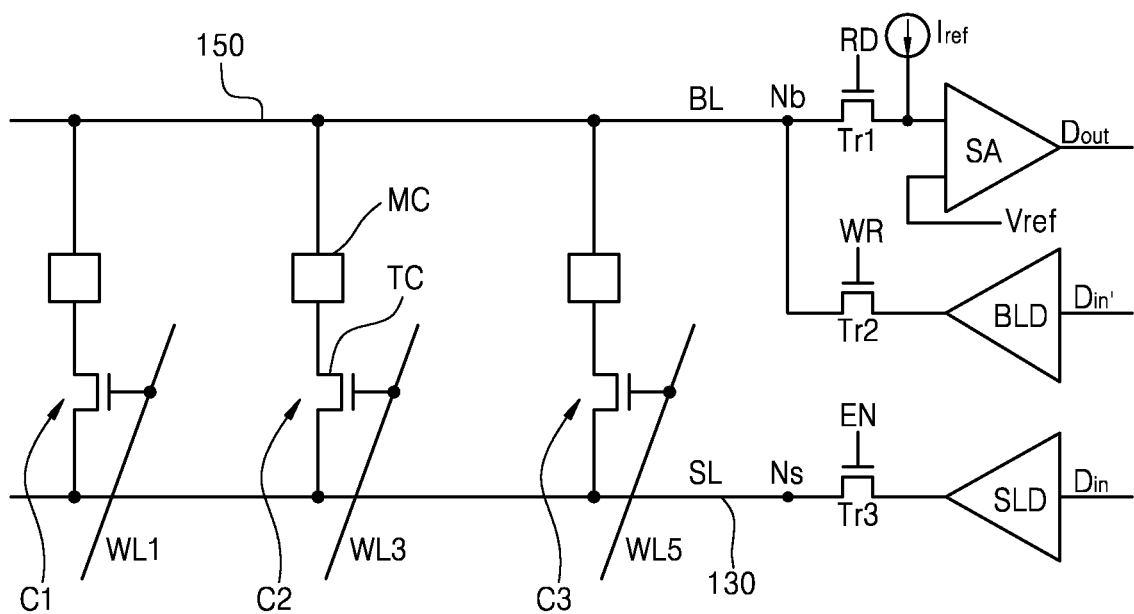
FIG. 3 is a circuit diagram of memory cells in one row in the variable resistance memory device of FIG. 1.

FIG. 3 is a circuit diagram for explaining memory cells in one row of the variable resistance memory device of FIG. 1.

In detail, in FIG. 3, a plurality of memory cells C1, C2, and C3 are connected between one bit line BL (150) and one source line SL (130). A cell transistor TC of each of the plurality of memory cells C1, C2, and C3 may be connected to second, fourth, and sixth word lines WL1, WL3, and WL5.

The bit line BL (150) is connected to a bit line driver BLD and a sense amplifier SA via a first node Nb. The source lines SL (130) is connected to a source line driver SLD via a second node Ns. The bit line driver BLD, the sense amplifier SA, and the source line driver SLD may be arranged in the write driver and sense amplifier region 30 of FIG. 1. For example, circuits positioned at right sides of the first node Nb and the second node may be arranged in the write driver and sense amplifier region 30. Left sides of the first node Nb and the second node Ns may correspond to a memory cell array 10.

A transistor Tr2 may be connected between the first node Nb of the bit line BL (150) and the bit line driver BLD and may be controlled by a write signal WR. The write signal WR may have a turn-on level when data is recorded on one memory cell among the memory cells C1, C2, and C3.

A transistor Tr1 may be connected between the first node Nb of the bit line BL (150) and the sense amplifier SA and may be controlled by a read signal RD. The read signal RD may have a turn-on level when data is read from one memory cell among the memory cells C1, C2, and C3.

A transistor Tr3 may be connected between the second node Ns of the source line SL (130) and the source line driver SLD and may be controlled by an enable signal EN. The enable signal EN may have a turn-on level when one among the write signal WR and the read signal RD.

Input data Din may be applied to an input terminal of the BLD. Inverted input data Din' may be input into an input terminal of the source line driver SLD. For example, the bit line driver BLD may output a high voltage when the input data Din is "1", for example, and may output a low voltage when the input data Din is "0", for example.

Contrary to this, the source line driver SLD may output a low voltage when the input data Din is "1", for example, and may output a high voltage when the input data Din is "0", for example. In this case, the high voltage may be 1.2V, for example, and the low voltage may be 0V, for example. The high voltage and the low voltage may be example values, and embodiments are not limited to the above examples.

A reference voltage Vref and the bit line BL (150) may be connected to the input terminal of the sense amplifier SA. The sense amplifier SA may output "1", for example, as output data Dout when a voltage of the bit line BL (150) is greater than the reference voltage Vref, and the sense amplifier SA may output "0", for example, as output data Dout when the voltage of the bit line BL (150) is less than the reference voltage Vref. This is just an example. On the other hand, the sense amplifier SA may output "0" when the voltage of the bit line (150) is greater than the reference voltage Vref, and the sense amplifier SA may also output "1" when the voltage of the bit line BL (150) is less than the reference voltage Vref.

A reference current Iref may be applied to the bit line BL (150). The reference current Iref may be applied to the bit line BL (150) when the read signal RD has a turn-on level. The reference current Iref flows via a current path that passes through the selected memory cell C, and a voltage of the bit line BL (150) at the input terminal of the sense amplifier SA may be determined as a value obtained by adding a product of the entire resistance on the current path and the reference current Iref to the voltage of the source line SL (130).

For example, when a resistance of the cell memory MC of the selected memory cell C is high, the voltage of the bit line BL (150) may be greater than the reference voltage Vref, and when a resistance of the cell memory MC of the memory cell C is low, the voltage of the bit line BL (150) may be less than the reference voltage Vref.

Figure 4:
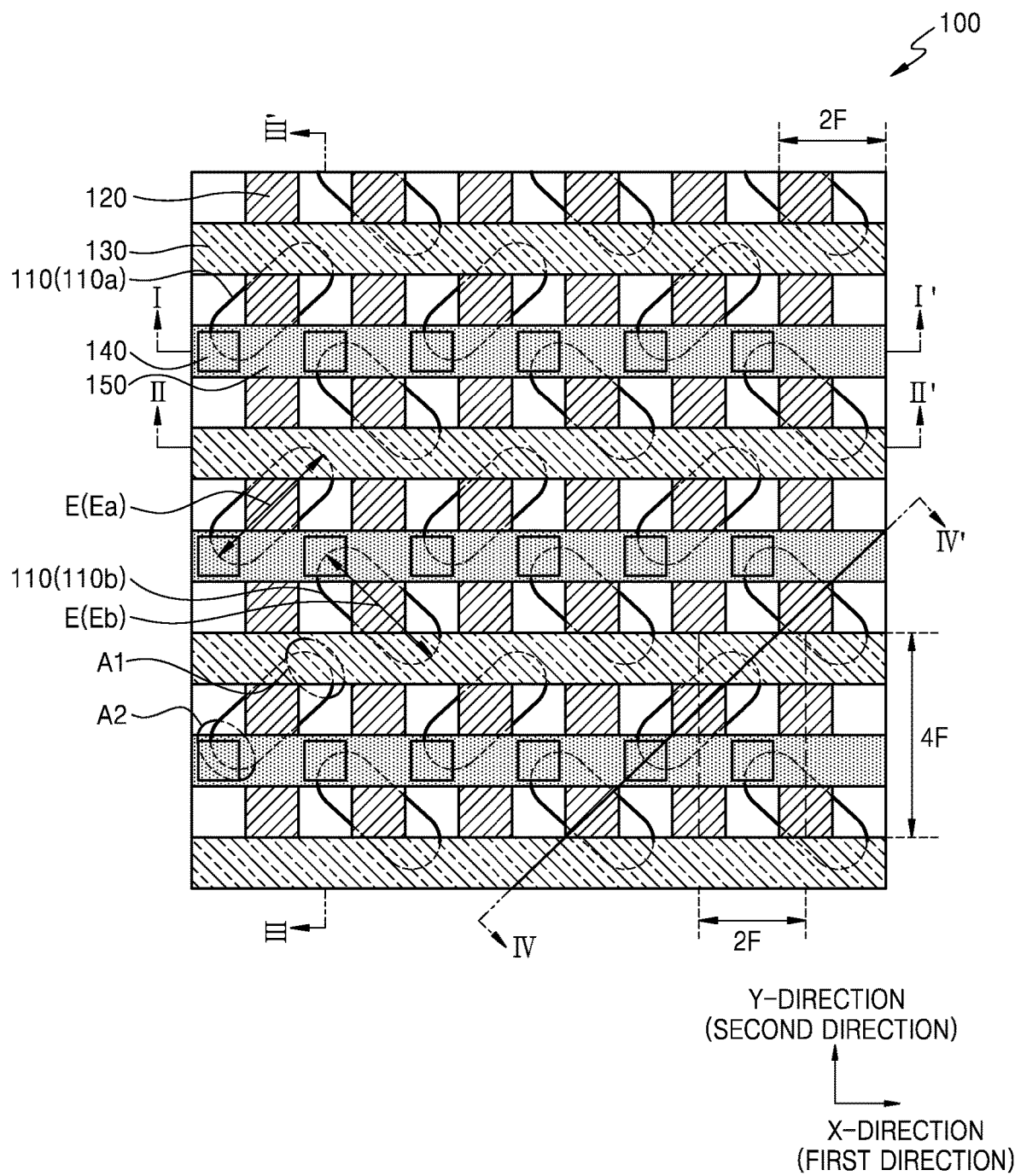
FIG. 4 is a layout diagram of a variable resistance memory device according to some embodiments of inventive concepts.

FIG. 4 is a layout diagram of a variable resistance memory device according to some embodiments of inventive concepts.

In detail, the layout of FIG. 4 may correspond to the memory cell array (see 10 of FIG. 1) of the variable resistance memory device 100 of FIG. 1. The variable resistance memory device 100 may include a plurality of memory cells (see C of FIG. 1) arranged in a matrix form. The variable resistance memory device 100 may include an active region 110, a word line 120, a source line 130, a variable resistance structure 140, and a bit line 150.

The active region 110 may be defined by an isolation layer (not shown) on a substrate (not shown). For example, the active region 110 may extend in an extension direction E, as indicated by a double-arrow and may be at an oblique angle with respect to the first direction (X-direction). For example, the active region 110 may be at a first angle θ that corresponds to an acute angle with respect to the first direction (X-direction). For example, the first angle θ may be about 45°. Also, the active region 110 may be at an oblique angle with respect to the second direction (Y-direction).

The active region 110 may have a first region A1 and a second region A2 at both ends thereof. A portion of the first region A1 that is connected to the source line 130 may overlap the source line 130. The first region A1 may be a source or drain region in an aspect of a transistor. A portion of the second region A2 that is connected to the bit line 150 may overlap the bit line 150. The second region A2 may be a drain or source region in an aspect of a transistor. The second region A2 of the active region 110 may be connected to the bit line 150 via the variable resistance structure 140.

The active regions 110 may be arranged parallel to one another along the first direction (X-direction) and the second direction (Y-direction), as illustrated. An extension direction Ea of first active regions 110a arranged along one word line 120 that extends in the second direction (Y-direction) may be different from an extension direction Eb of second active regions 110b arranged along the word line 120 adjacent to one word line 120.

For example, the extension direction Ea of the first active regions 110a may be orthogonal with respect to the extension direction Eb of the second active regions 110b. The first active regions 110a may be below the source line 130 and above the bit line 150 in FIG. 4. Also, the second active regions 110b may be below the bit line 150 and above the source line 130 in FIG. 4.

The active region 110 may include a semiconductor material layer that may be a substrate, or a semiconductor material layer separately formed on the substrate. For example, the active region 110 may be formed as a silicon layer formed on the substrate through deposition or epitaxial growth. The silicon layer may be a monocrystalline silicon layer or a polysilicon layer.

The word lines 120 may be arranged parallel to one another in the first direction (X-direction) to be spaced apart from one another by a desired (and/or alternatively predetermined) distance while extending in the second direction (Y-direction). The word lines 120 may be arranged across the active regions 110 along the second direction (Y-direction). For example, the word lines 120 may be arranged across a space between the first region A1 and the second region A2 of each of the active regions 110 arranged along the second direction (Y-direction).

The word line 120 may include at least one material among a doped semiconductor, a metal, a conductive metal nitride, and a metal-semiconductor compound. The width of the word line 120 may be 1F, and a pitch between the word lines 120 in the first direction (X-direction) may be 2F. Here, F may represent a minimum lithographic feature size.

The source lines 130 may be arranged parallel to one another in the second direction (Y-direction) to be spaced apart from one another by a desired (and/or alternatively predetermined) distance while extending in the first direction (X-direction). Each of the source lines 130 may be electrically connected to the first region A1 of each of the active regions 110, and the source lines 130 may be arranged to overlap a portion of the first region A1. For example, the first region A1 of the first active regions 110a arranged between the bit lines 150 adjacent in a downward direction in FIG. 4 and the first region A1 of the second active regions 110b arranged between the bit lines 150 adjacent in an upward direction in FIG. 4 may be connected to each of the source lines 130. The first region A1 of each of the first active regions 110a and the first region A1 of each of the second active regions 110b may be commonly electrically connected to one source line 130.

The source line 130 may include at least one material among a metal, a conductive metal nitride, a metal-semiconductor compound, and a doped semiconductor. The width of the source line 130 may be 1F, and a pitch between the source lines 130 in the second direction (Y-direction) may be 4F.

The variable resistance structures 140 may be arranged along the first direction (X-direction) and the second direction (Y-direction) so as to correspond to the second region A2 of the active region 110. The variable resistance structures 140 may be arranged between the bit line 150 and the second region A2 of the active region 110 and may be connected to the second region A2 of the active region 110 as well as the bit line 150. The variable resistance structure 140 will now be described in more detail.

The bit lines 150 may be arranged parallel to one another in the second direction (Y-direction) to be spaced apart from one another by a desired (and/or alternatively predetermined) distance while extending in the first direction (X-direction) like in the source lines 130. The bit lines 150 may be arranged alternately with the source lines 130 along the second direction (Y-direction). The bit lines 150 may be electrically connected to the second region A2 of each of the active regions 110 and may be arranged to overlap a portion of the second direction A2. The bit lines 150 may be electrically connected to the second region A2 of each of the active regions 110 via the variable resistance structure 140.

The second region A2 of the second active regions 110b arranged between the source lines 130 adjacent in the downward direction in FIG. 4 and the second region A2 of the first active regions 110a arranged between the source lines 130 adjacent in the upward direction in FIG. 4 may be connected to each of the bit lines 150. The second region A2 of each of the first active regions 110a and the second region A2 of each of the second active regions 110b may be commonly electrically connected to one bit line 150 via the corresponding variable resistance structure 140.

The bit line 150 may include at least one material among metal, conductive metal nitride, a metal-semiconductor compound, and a doped semiconductor. The width of the bit line 150 may be 1F, and a pitch between the bit lines 150 in the second direction (Y-direction) may be 4F.

FIGS. 5A through 5D are through 5D are cross-sectional views of main elements taken along lines I-I', and IV-IV' of FIG. 4, respectively.

In detail, the variable resistance memory device 100 may include a substrate 101 on which an isolation layer 103 is formed. The active regions 110 that extend parallel to one another at an oblique angle with respect to the first direction (X-direction) may be defined on the substrate 101 by the isolation layer 103. The isolation layer 103 may be formed within isolation trenches T1 formed in the substrate 101.

The substrate 101 may be formed of a semiconductor material. In some embodiments, the substrate 101 may include a compound semiconductor material, for example, a semiconductor element such as germanium (Ge), silicon carbide (SiC), gallium arsenide (GaAs), indium arsenide (InAs), and indium phosphide (InP). In some embodiments, the substrate 101 may have a silicon on insulator (SOI) structure. For example, the substrate 101 may include a buried oxide layer (BOL). In some embodiments, the substrate 101 may include a conductive region, for example, a well doped with an impurity, or a structure doped with an impurity.

The word lines 120 may extend on the active regions 110 along the second direction (Y-direction). The word lines 120 may be arranged parallel to one another with a desired (and/or alternatively predetermined) distance, for example, with a pitch of 2F.

Each of the word lines 120 may have a buried word line structure buried within the substrate 101 to have a top surface at a lower level than a top surface 101T of the substrate 101. However, inventive concepts are not limited thereto. For example, each of the word lines 120 may also be formed to have a top surface at a higher level than the top surface 101T of the substrate 101.

The word lines 120 may be formed within gate trenches T2 formed in the substrate 101. A gate dielectric layer 122 may be formed in the gate trenches T2 so as to insulate the plurality of word lines 120 from the substrate 101. A buried insulating layer 125 may be filled in upper portions of the word lines 120 within the gate trenches T2. In some embodiments, each of the word lines 120 may include at least one material among a doped semiconductor, metal, conductive metal nitride, and a metal-semiconductor compound.

In some embodiments, the gate dielectric layer 122 may be formed of at least one selected from the group consisting of a silicon oxide layer, a silicon nitride layer, a silicon oxynitride layer, an oxide/nitride/oxide (ONO), and a high-k dielectric film having a higher dielectric constant than that of the silicon oxide layer. In some embodiments, the buried insulating layer 125 may include at least one material among silicon nitride, silicon oxide layer, and silicon oxynitride.

Source lines 130 may be formed on the top surface 101T of the substrate 101 and the isolation layer 103. The source lines 130 may be electrically connected to the first region A1 of the active region 110 adjacent to the first region (see A1 of FIG. 4) of the active region 110. The source lines 130 may be arranged parallel to one another in the second direction (Y-direction) to be spaced apart from one another by a desired (and/or alternatively predetermined) distance while extending in the first direction (X-direction).

A metal silicide layer (not shown) may be formed between the source lines 130 and the active region 110. The metal silicide layer may be used to reduce a contact resistance between a source/drain region formed in the active region 110, for example, a first region (see A1 of FIG. 4) of the active region 110 and the source lines 130. However, the metal silicide layer may be omitted, and as illustrated, the source lines 130 may be in direct contact with the first region A1 of the active region 110.

In some embodiments, the source lines 130 may have a buried structure that may be lower than that the top surface 101T of the substrate 101. Even when the source lines 130 are formed to have a buried structure, the source lines 130 cross the word lines 120. Thus, the source lines 130 may be formed at a higher position than top surfaces of the word lines 120.

First and second interlayer insulating layers 161 and 162 may be formed on the top surface 101T of the substrate 101 and the isolation layer 103 so as to cover the source lines 130. The first and second interlayer insulating layers 161 and 162 may be formed of oxide layers, nitride layers, or a combination thereof. The first and second interlayer insulating layers 161 and 162 include two layers, but may include more insulating layers in some embodiments. A material of the first insulating layer 161 may be the same as or different than a material of the second insulating layer 162.

Figure 5A:
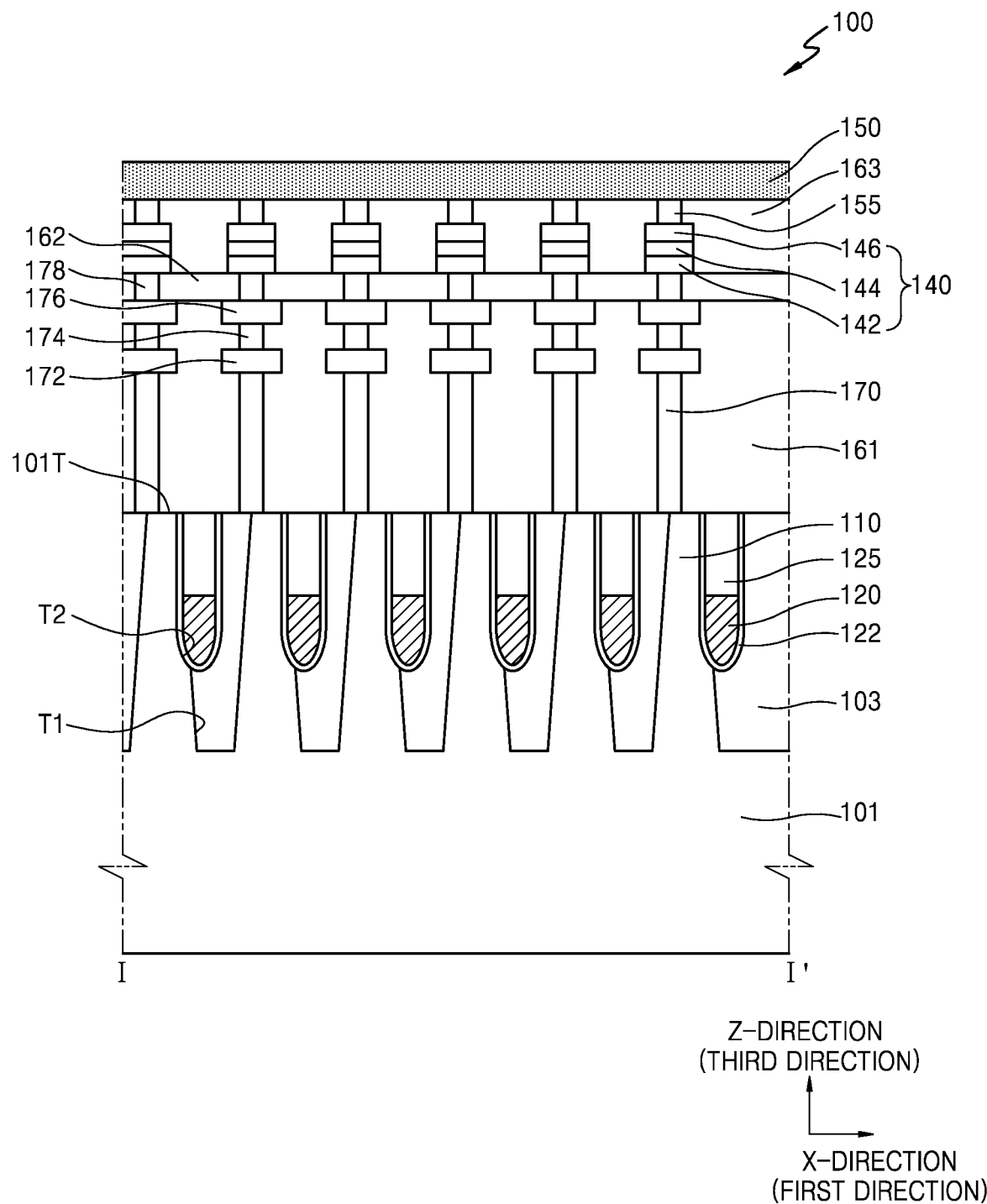
FIGS. 5A through 5D are cross-sectional views of main elements taken along lines I-I', and IV-IV' of FIG. 4, respectively.
Figure 5B:
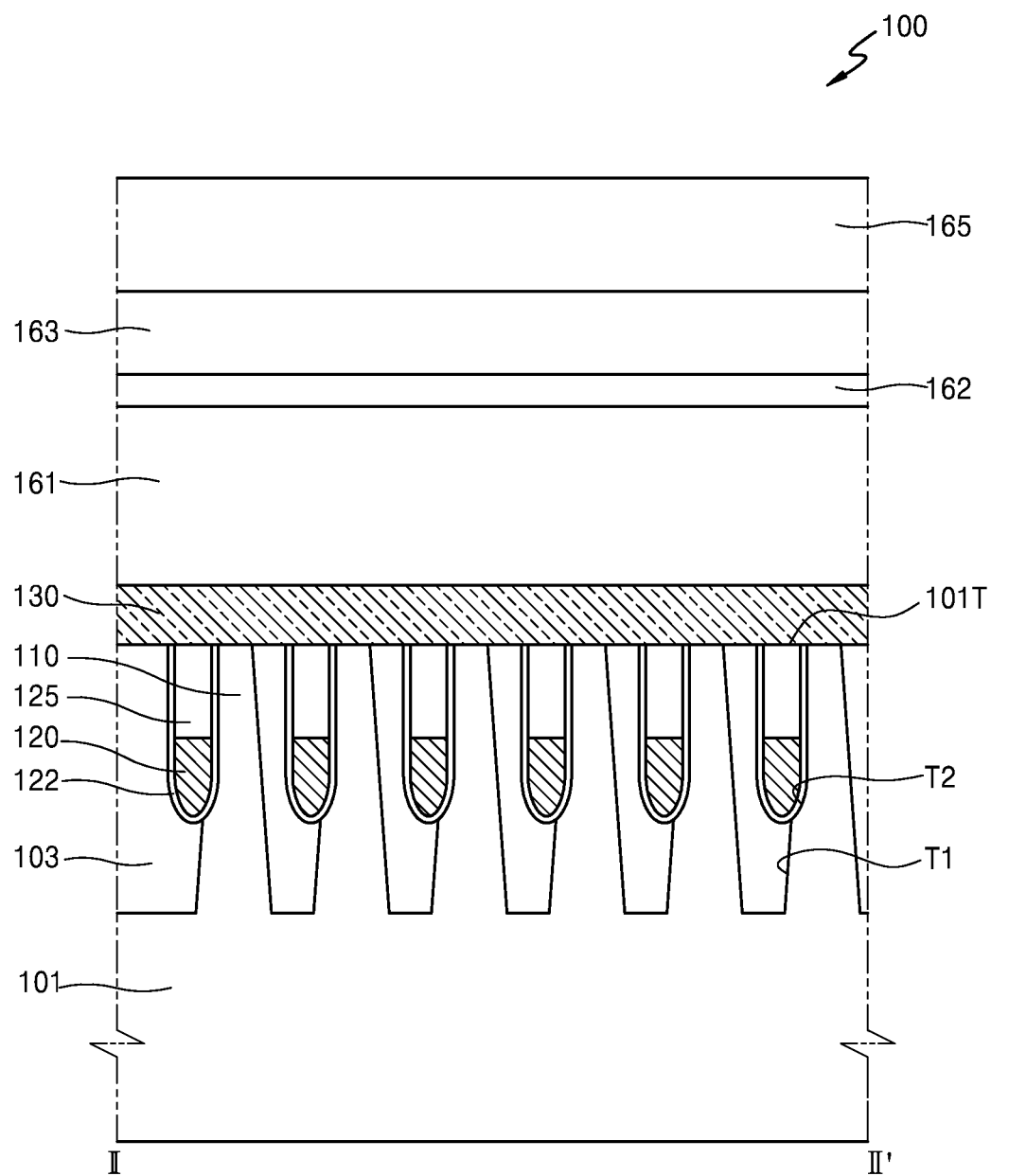

First and second metal interconnection layers 172 and 176 may be formed inside the first and second interlayer insulating layers 161 and 162 on the top surface 101T of the substrate 101 and the isolation layer 103 so as to be insulated from the first and second interlayer insulating layers 161 and 162. In FIGS. 5A and 5D, the first and second metal interconnection layers 172 and 176 include two layers. However, the first and second metal interconnection layers 172 and 176 may include more metal layers in some embodiments. The first and second metal interconnection layers 172 and 176 may include copper layers.

The first and second metal interconnection layers 172 and 176 may be electrically connected to the active region 110 of the substrate 101 or the variable resistance structure 140 via first through third contact plugs 170, 174, and 178. The first and second metal interconnection layers 172 and 176 may be connected to sources or drains of the cell transistor (see TC of FIG. 1). The first through third contact plugs 170, 174, and 178 may pass through the first and second interlayer insulating layers 161 and 162 and may be in contact with the second region (see A2 of FIG. 4) of the active regions 110. The first through third contact plugs 170, 174, and 178 may have a cylindrical structure.

However, the structure of the first through third contact plugs 170, 174, and 178 is not limited to the cylindrical structure. For example, the first through third contact plugs 170, 174, and 178 may be formed to have various polygonal column shapes, such as a rectangular column shape, a pentagonal column shape, or an oval column structure. Also, the first through third contact plugs 170, 174, and 178 may be gradually thinner as getting closer to a downward direction and may have a structure in which a diameter of an upper portion of each of the first through third contact plugs 170, 174 and 178 is greater than a diameter of a lower portion thereof.

A metal silicide layer (not shown) may be formed between the first contact plug 170 and the second region A2 of the active regions 110. The metal silicide layer may be used to reduce a contact resistance between the second region A2 of the active regions 110, for example, source/drain regions of the active regions 110 and the first contact plug 170. However, the metal silicide layer may be omitted, and as illustrated, the first contact plug 170 may also be in direct contact with the second region A2 of the active region 110.

Variable resistance structures 140 may be arranged on the third contact plug 178. The variable resistance structures 140 may be electrically insulated from one another due to the third interlayer insulating layer 163. The third interlayer insulating layer 163 may include an oxide layer, a nitride layer, or a combination thereof. The third interlayer insulating layer 163 has a single-layer structure. However, embodiments are not limited thereto, and the third interlayer insulating layer 163 may have a multi-layer structure formed of the same materials or different materials. Each of the variable resistance structures 140 may be connected to the second region A2 of the corresponding active region 110 via the first through third contact plugs 170, 174, and 178. The third contact plug 178 and the variable resistance structures 140 will now be described in more detail.

Each of the variable resistance structures 140 may store data according to a resistance state. Each of the variable resistance structures 140 may include an MTJ device. For example, each of the variable resistance structures 140 may include a lower electrode 142, an upper electrode 146, and a variable resistance layer 144 disposed between the lower electrode 142 and the upper electrode 146. The variable resistance layer 144 may include, for example, a first magnetization layer, a tunnel barrier layer, and a second magnetization layer, which are sequentially stacked.

Bit lines 150 may be formed above the variable resistance structures 140. The bit lines 150 may be arranged parallel to one another in the second direction (Y-direction) while extending in the first direction (X-direction). The bit lines 150 may be electrically insulated from one another due to the fourth interlayer insulating layer 165. The fourth interlayer insulating layer 165 may include an oxide layer, a nitride layer, or a combination thereof. The fourth interlayer insulating layer 165 has a single-layer structure. However, embodiments are not limited thereto, and the fourth interlayer insulating layer 165 may also be formed to have a multi-layer structure formed of the same material or different materials.

The bit lines 150 may be electrically connected to the corresponding variable resistance structures 140 via the fourth contact plug 155. The bit lines 150 may be electrically connected to the second region A2 of the active region 110 via the fourth contact plugs 155, the variable resistance structures 140, and the first through third contact plugs 170, 174, and 178.

In some embodiments, the bit lines 150 may include at least one material among metal, conductive metal nitride, a metal-semiconductor compound, and a doped semiconductor. For example, the bit lines 150 may include a barrier layer formed of tantalum (Ta), titanium (Ti), tantalum nitride (TaN), titanium nitride (TiN), or a combination thereof, and a metal layer formed on the barrier layer, for example, a copper (Cu) layer.

Figure 6A:
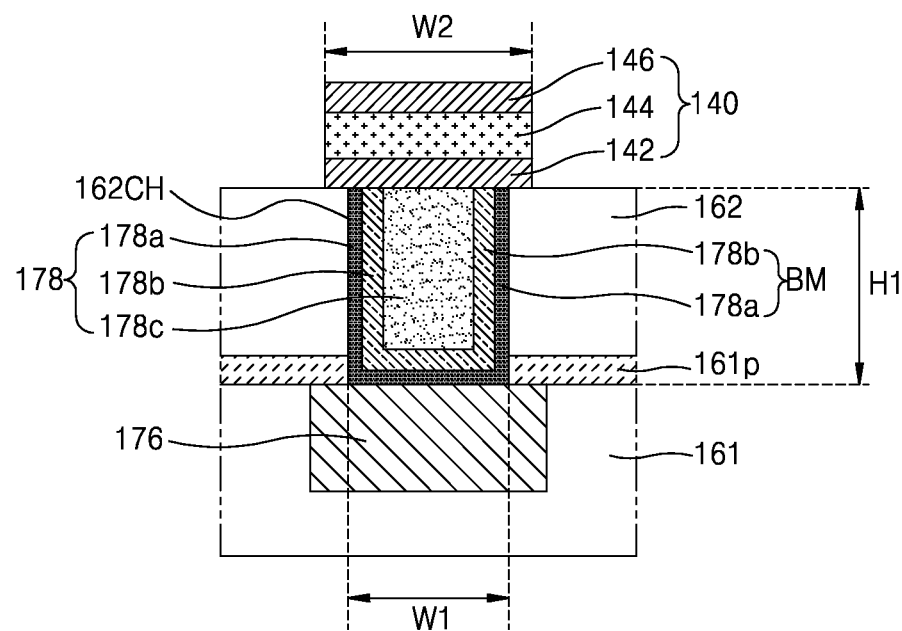
FIGS. 6A and 6B are cross-sectional views of a configuration for connecting a metal interconnection layer to a variable resistance structure of a variable resistance memory device via a contact plug, according to some embodiments of inventive concepts.
Figure 6B:
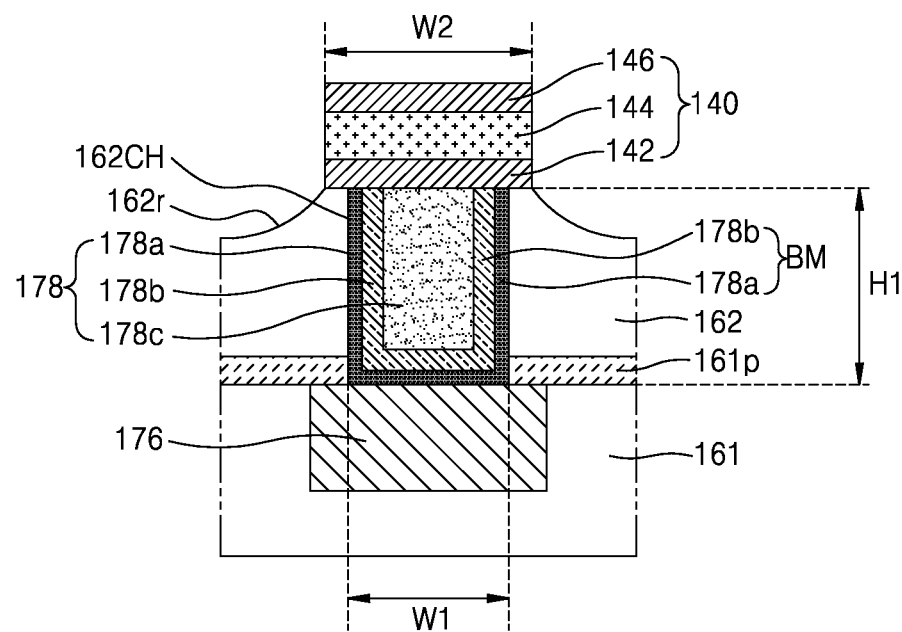

FIGS. 6A and 6B are cross-sectional views of a configuration for connecting a metal interconnection layer to a variable resistance structure of a variable resistance memory device via a contact plug, according to some embodiments of inventive concepts.

Figure 5C:
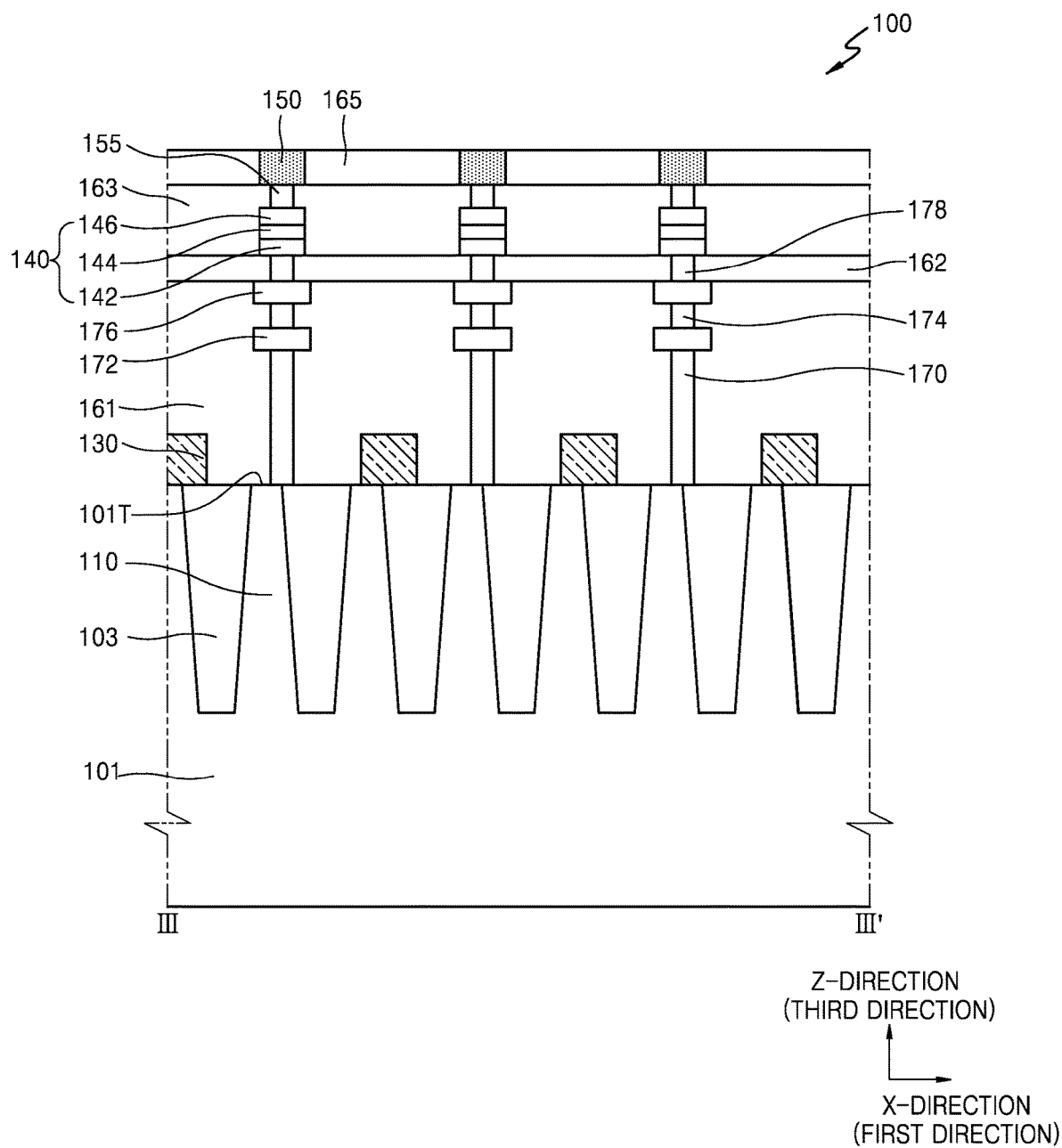
Figure 5D:
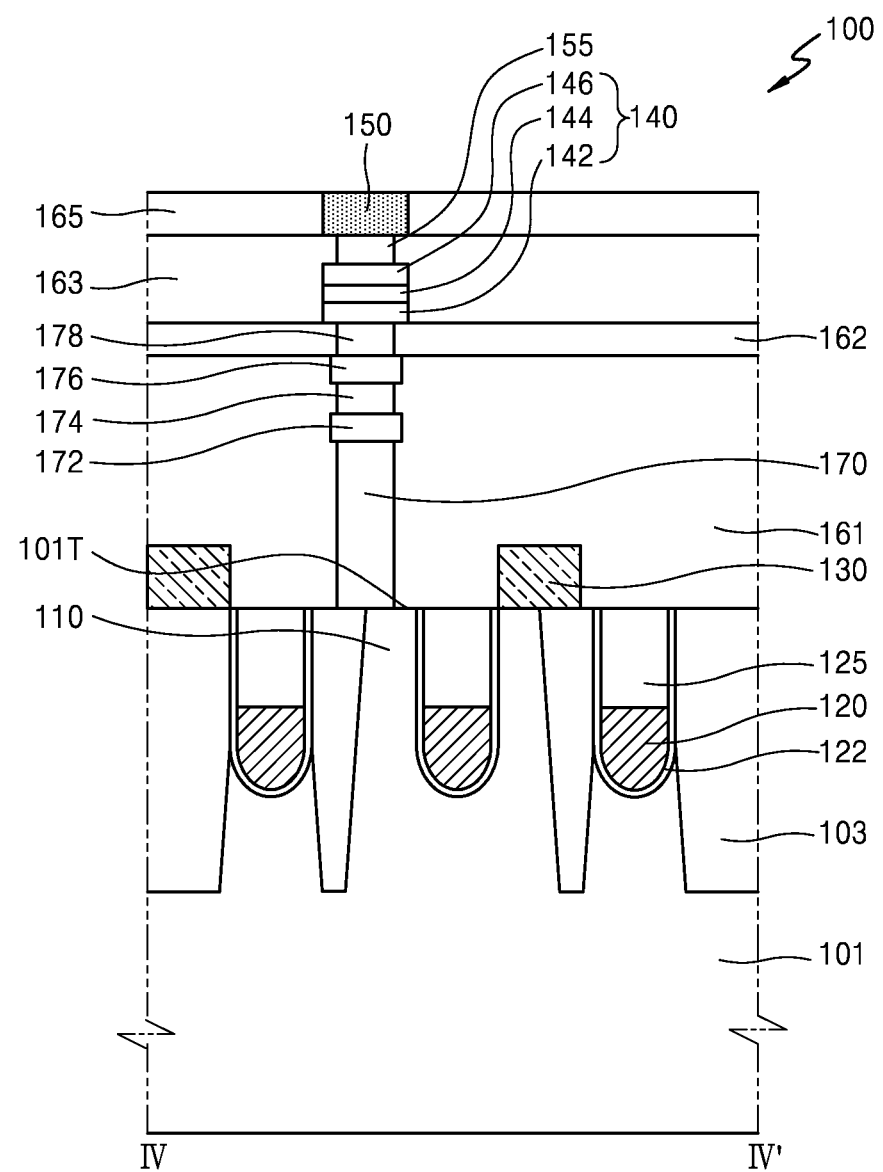

In detail, FIGS. 6A and 6B illustrate the second metal interconnection layer 176, the third contact plugs 178, and the variable resistance structures 140 of the variable resistance memory device (see 100 of FIG. 4) of FIGS. 5A, 5C, and 5D. FIG. 6B may be the same as FIG. 6A except that, when patterning for forming the variable resistance structures 140 is performed, the surface of the second interlayer insulating layer 162 is etched and a recess part 162r is formed.

Here, the second metal interconnection layer 176 is referred to as a metal interconnection layer 176, and the third contact plug 178 is referred to as a contact plug 178. FIGS. 6A and 6B are provided to explain that the metal interconnection layer 176 is connected to the variable resistance structures 140 of the variable resistance memory device (see 100 of FIG. 4) via the contact plug 178.

In the variable resistance memory device (see 100 of FIG. 4), the metal interconnection layer 176 may be formed within the first interlayer insulating layer 161 on a substrate (see 101 of FIGS. 5A through 5D). The metal interconnection layer 176 may include a Cu layer, as described above. The metal interconnection layer 176 may be formed using a damascene process.

An etch-stop layer 161p may be formed on the first interlayer insulating layer 161 in some embodiments or may be omitted. The etch-stop layer 161p may limit and/or prevent etching of the first interlayer insulating layer 161 when contact holes are formed in the metal interconnection layer 176. The etch-stop layer 161p may be formed as a silicon carbon nitride (SiCN) layer.

A second interlayer insulating layer 162 having a contact hole 162CH for exposing a portion of the metal interconnection layer 176 may be formed on the etch-stop layer 161p. The contact hole 162CH may be formed by selectively etching a portion of the second interlayer insulating layer 162. The contact hole 162CH may be formed by patterning the second interlayer insulating layer 162 using photolithography. A first width of the contact hole 162CH may be W1. The first width W1 may be several nanometers. A first height of the contact hole 162CH may be H1. The first height H1 may be several thousands of nanometers (e.g., 3,000 to 9,000 nm).

A barrier metal layer BM including a plurality of sub-barrier metal layers 178a and 178b is formed in the contact hole 162CH. The barrier metal layer BM may include a first sub-barrier metal layer 178a and a second sub-barrier metal layer 178b. The first sub-barrier metal layer 178a may be in direct contact with the metal interconnection layer 176.

A first sub-barrier metal layer 178a may be formed on the metal interconnection layer 176 within the contact hole 162CH. The first sub-barrier metal layer 178a may be formed on a bottom and an inner wall of the contact hole 162CH. The second sub-barrier metal layer 178b may be formed on the first sub-barrier metal layer 178a and under a plug metal layer 178c that will be described below.

The first sub-barrier metal layer 178a may include an amorphous layer. The second sub-barrier metal layer 178b may include a crystalline layer. The first sub-barrier metal layer 178a may be an elution-preventing layer for limiting and/or preventing elution of the metal interconnection layer 176 when a chemical-mechanical polishing (CMP) process is performed to form the contact plug 178 having a width W1 of several tens of nanometers and a height H1 of several thousands of nanometers. The first sub-barrier metal layer 178a may be the metal interconnection layer 176, for example, a diffusion-preventing layer for limiting and/or preventing diffusion of the Cu layer.

The second sub-barrier metal layer 178b may be a coupling enhancement layer for enhancing coupling with the plug metal layer 178c. Due to the second sub-barrier metal layer 178b, a problem that the plug metal layer 178c is removed or pulled out, when a CMP process is performed so as to form the contact plug 178 having a width W1 of several tens of nanometers (e.g., 30 to 90 nm) and a height H1 of several thousands of nanometers, may be solved.

The second sub-barrier metal layer 178b may be a reaction-preventing layer for limiting and/or preventing a reaction with the metal interconnection layer 176. When a plug metal layer 178c, for example, a tungsten (W) layer is formed, the second sub-barrier metal layer 178b may be a reaction-preventing layer for limiting and/or preventing a reaction between the metal interconnection layer 176, for example, Cu, and a source for forming the plug metal layer 178c, for example, a fluorine (F) gas (a reaction between Cu and F).

The first sub-barrier metal layer 178a may include a tungsten nitride (WN) layer or a tantalum nitride (TaN) layer. The WN or TaN layer has excellent tolerance to migration of Cu that constitutes the metal interconnection layer 176. The second sub-barrier metal layer 178b may include a titanium nitride (TiN) layer. When tungsten (W) that constitutes the plug metal layer 178c is grown on the TiN layer, growth characteristics of a W layer are excellent. In FIGS. 6A and 6B, the barrier metal layer BM includes two sub-barrier metal layers 178a and 178b. However, the barrier metal layer BM may include three or more layers in some embodiments.

The plug metal layer 178c is formed on the barrier metal layer BM so as to bury the contact hole 162CH. The plug metal layer 178c may be in direct contact with the variable resistance structure 140. The plug metal layer 178c may be formed on the second sub-barrier metal layer 178b so as to bury the contact hole 162CH. The plug metal layer 178c may include a W layer.

The barrier metal layer BM and the plug metal layer 178c may constitute (or form) the contact plug 178. Because the contact plug 178 is formed within the contact hole 162CH, the first width may be W1. The height of the contact plug 178 may be H1. The contact plug 178 may be formed by forming a barrier metal layer and a plug metal material layer inside the contact hole 162H and on the second interlayer insulating layer 162 and then by performing a CMP process, as will be described below.

The variable resistance structure 140 may be formed on the barrier metal layer BM and the plug metal layer 178c. The variable resistance structure 140 may include a lower electrode 142, an upper electrode 146, and a variable resistance layer 144 between the lower electrode 142 and the upper electrode 146, as described above. The variable resistance layer 144 that constitutes (or forms) the variable resistance structure 140 may include an MTJ device, as described above.

A second width of the variable resistance structure 140 may be W2. The second width W2 of the variable resistance structure 140 may be greater than the first width W1 of the contact plug 178. When the second width W2 of the variable resistance structure 140 is greater than the first width W1 of the contact plug 178, the variable resistance structure 140 may be easily formed without any damage to the contact plug 178.

The variable resistance structure 140 may be formed by forming a variable resistance structure material layer on the contact plug 178 and the second interlayer insulating layer 162, as will be described below, and then by etching the variable resistance structure material layer using photolithography. Thus, when the second width W2 of the variable resistance structure of several tens of nanometers (e.g., 30 to 90 nm) is greater than the first width W1 of the contact plug 178, damage to the contact plug 178 may be reduced. Furthermore, as illustrated in FIG. 6B, the surface of the second interlayer insulating layer 162 may be etched so that a recess part 162r may be formed.

The variable resistance memory device 100 having the above configuration may include the first sub-barrier metal layer 178a and the second sub-barrier metal layer 178b so as to easily connect the metal interconnection layer 176 to the variable resistance structure 140 via a contact plug. In the current embodiment, for convenience, the barrier metal layer BM is divided into the first sub-barrier metal layer 178a and the second sub-barrier metal layer 178b. However, the first sub-barrier metal layer 178a and the second sub-barrier metal layer 178b may also be referred to as a first barrier metal layer 178a and a second barrier metal layer 178b, respectively.

Figure 7A:
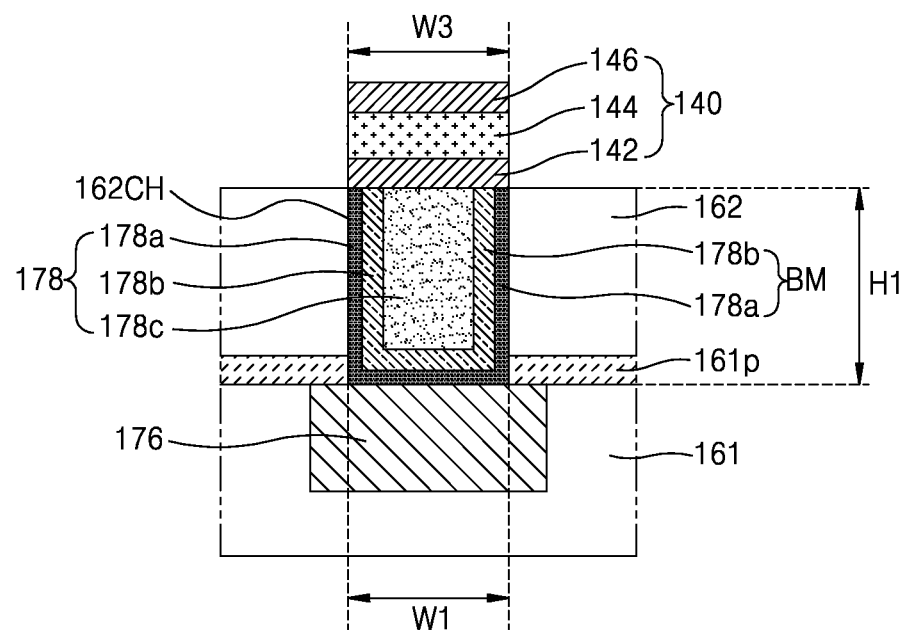
FIGS. 7A and 7B are cross-sectional views of a configuration for connecting a metal interconnection layer to a variable resistance structure of a variable resistance memory device via a contact plug, according to some embodiments of inventive concepts.
Figure 7B:
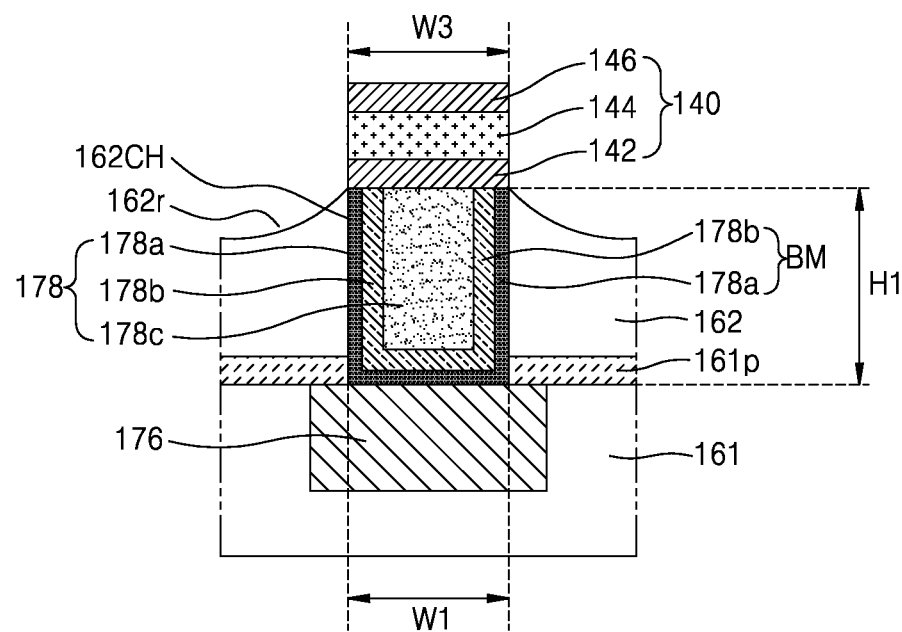

FIGS. 7A and 7B are cross-sectional views of a configuration for connecting a metal interconnection layer to a variable resistance structure of a variable resistance memory device via a contact plug, according to some embodiments of inventive concepts.

In detail, FIGS. 7A and 7B may be the same as FIGS. 6A and 6B except that a third width W3 of a variable resistance structure 140 is equal to a first width W1 of a contact plug 178. Thus, the same description of FIGS. 7A and 7B as that of FIGS. 6A and 6B will be omitted or simply provided.

In a variable resistance memory device (see 100 of FIG. 4), a metal interconnection layer 176 is formed within the first interlayer insulating layer 161 on a substrate (see 101 of FIGS. 5A through 5D). A contact plug 178 may be formed within the second interlayer insulating layer 162 on the metal interconnection layer 176, may be connected to the metal interconnection layer 176 and may have a first width W1 and a first height. The first width W1 may be several tens of nanometers. The first height H1 may be several thousands of nanometers.

The variable resistance structure 140 having a third width W3 may be formed on the contact plug 178. The third width W3 may be equal to the first width W1. When the third width W3 of the variable resistance structure 140 is equal to the first width W1 of the contact plug 178, a degree of integration of the variable resistance memory device 100 may be increased compared to that of FIGS. 6A and 6B.

FIGS. 8A through 8E are cross-sectional views illustrating a method of manufacturing a variable resistance memory device, according to some embodiments of inventive concepts.

In detail, FIGS. 8A through 8E illustrate a manufacturing process of connecting the metal interconnection layer and the variable resistance structure illustrated in FIG. 6A via a contact plug. The same description of FIGS. 8A through 8E as that of FIG. 6A will be omitted or simply provided.

Figure 8A:
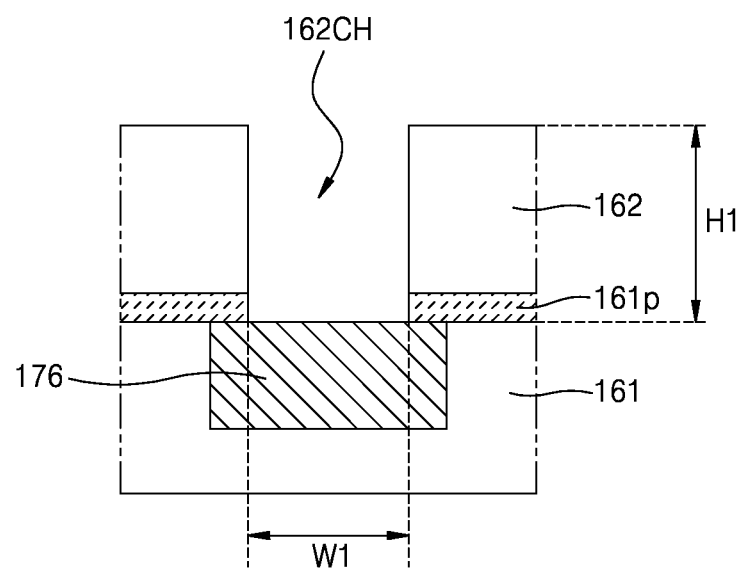
FIGS. 8A through 8E are cross-sectional views illustrating a method of manufacturing a variable resistance memory device, according to some embodiments of inventive concepts.

Referring to FIG. 8A, a metal interconnection layer 176 is formed within the first interlayer insulating layer 161 on the substrate (see 101 of FIGS. 5A through 5D). The metal interconnection layer 176 may be formed as a Cu layer. The metal interconnection layer 176 may be formed using a damascene process. An etch-stop layer 161p may be formed on the first interlayer insulating layer 161 in some embodiments or the etch-stop layer 161p may be omitted.

A second interlayer insulating layer 162 having a contact hole 162H for exposing a portion of the metal interconnection layer 176 is formed on the etch-stop layer 161p. The second interlayer insulating layer 162 may be formed by forming an interlayer insulating material layer on the etch-stop layer 161p and then by selectively etching the interlayer insulating material layer using photolithography. The contact hole 162CH may have a first width W1 and a first height H1. The first width W1 may be several tens of nanometers. The first height H1 may be several thousands of nanometers.

Figure 8B:
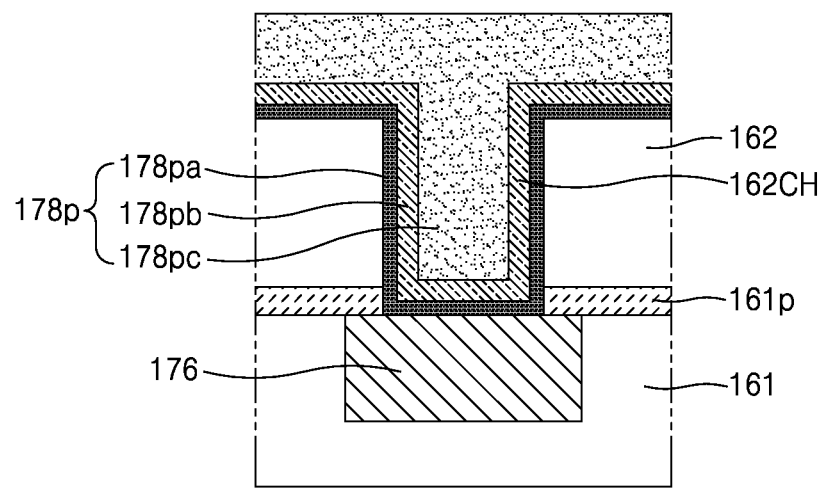

Referring to FIG. 8B, a contact plug material layer 178p including a first barrier metal material layer 178pa, a second barrier metal material layer 178pb, and a plug metal material layer 178pc is sequentially formed inside the contact hole 162CH and on the second interlayer insulating layer 162. The first barrier metal material layer 178pa and the second barrier metal material layer 178pb may be in-situ formed without vibration brake using a cluster deposition device, as will be described below. Thus, a contact resistance of the first barrier metal material layer 178pa may be reduced.

Furthermore, the first barrier metal material layer 178pa, the second barrier metal material layer 178pb, and the plug metal material layer 178pc may be in-situ formed without vacuum brake using a cluster deposition device. A contact resistance of the first barrier metal material layer 178pa and the second barrier metal material layer 178pb may be reduced.

The first barrier metal material layer 178pa may be formed using physical vapor deposition (PVD) or atomic layer deposition (ALD). The second barrier metal material layer 178pb may be formed using PVD or ALD. Preferably, the second barrier metal material layer 178pb may be formed using ALD.

The first barrier metal material layer 178pa may include a WN layer or a TaN layer. The second barrier metal material layer 178pb may include a TiN layer. The plug metal material layer 178pc may include a W layer.

The first barrier metal material layer 178pa is formed on a bottom and an inner wall of the contact hole 162CH and on the second interlayer insulating layer 162 on the metal interconnection layer 176. The second barrier metal material layer 178pb is formed on the first barrier metal material layer 178pa. The plug metal material layer 178pc is formed to bury the contact hole 162CH on the second barrier metal material layer 178pb.

Figure 8C:
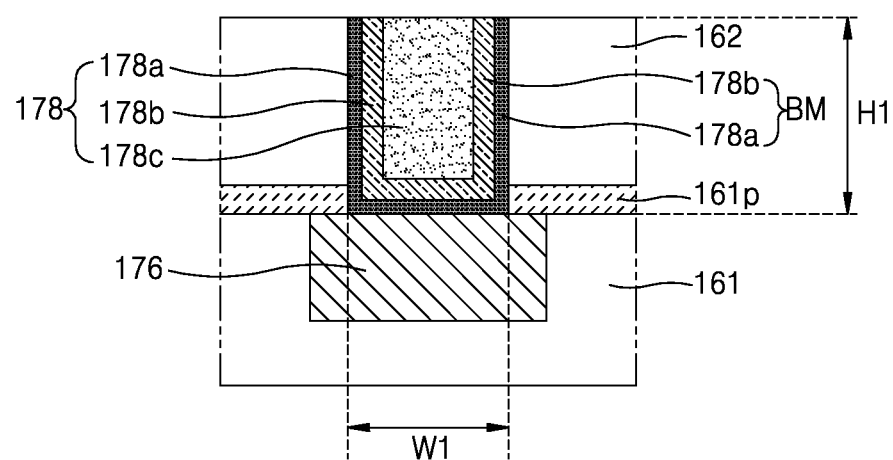

Referring to FIG. 8C, CMP is performed on the contact plug material layer 178p including the first barrier metal material layer 178pa, the second barrier metal material layer 178pb, and the plug metal material layer 178pc illustrated in FIG. 8B using the second interlayer insulating layer 162 as an etch-stop point.

Then, the first barrier metal material layer 178pa of FIG. 8B is a first sub-barrier metal layer 178a. The second barrier metal material layer 178pb of FIG. 8B is a second sub-barrier metal layer 178b. The plug metal material layer 178pc of FIG. 8B may be a plug metal layer 178c. The first sub-barrier metal layer 178a and the second barrier metal material layer 178pb are a barrier metal layer BM. The contact plug material layer 178p of FIG. 8B is a contact plug 178. The barrier metal layer BM and the plug metal layer 178c are the contact plug 178.

The first sub-barrier metal layer 178a may be an elution-preventing layer for limiting and/or preventing elution of the metal interconnection layer 176 when a CMP process is performed to form the contact plug 178 having a width W1 of several tens of nanometers and a height H1 of several thousands of nanometers, as described above. The first sub-barrier metal layer 178a may be a diffusion-preventing layer for limiting and/or preventing diffusion of the metal interconnection layer 176, for example, a Cu layer.

The second sub-barrier metal layer 178b may be a coupling enhancement layer for enhancing coupling with the plug metal material layer 178pc, as described above. Due to the second sub-barrier metal layer 178b, a problem that the plug metal layer 178c is removed or pulled out, when the CMP process is performed to form the contact plug 178 having the width W1 of several tens of nanometers (e.g., 30 to 90 nm). and the height H1 of several thousands of nanometers (e.g., 3,000 to 9,000 nm).

The second sub-barrier metal layer 178b may be a reaction-preventing layer for limiting and/or preventing a reaction with the metal interconnection layer 176, as described above. The second sub-barrier metal layer 178b may be a reaction-preventing layer for limiting and/or preventing a reaction between the metal interconnection layer 176 and a source for forming a plug metal layer, for example, an F gas when the plug metal layer 178c, for example, a W layer is formed.

Figure 8D:
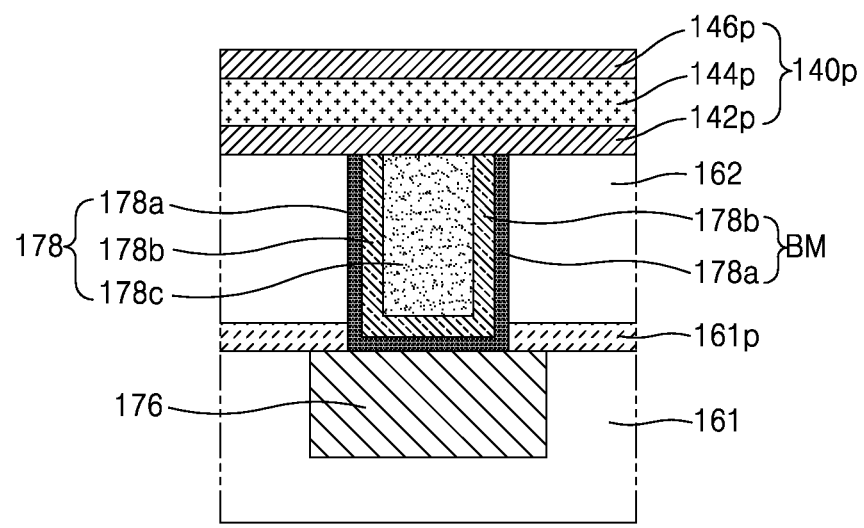
Figure 8E:
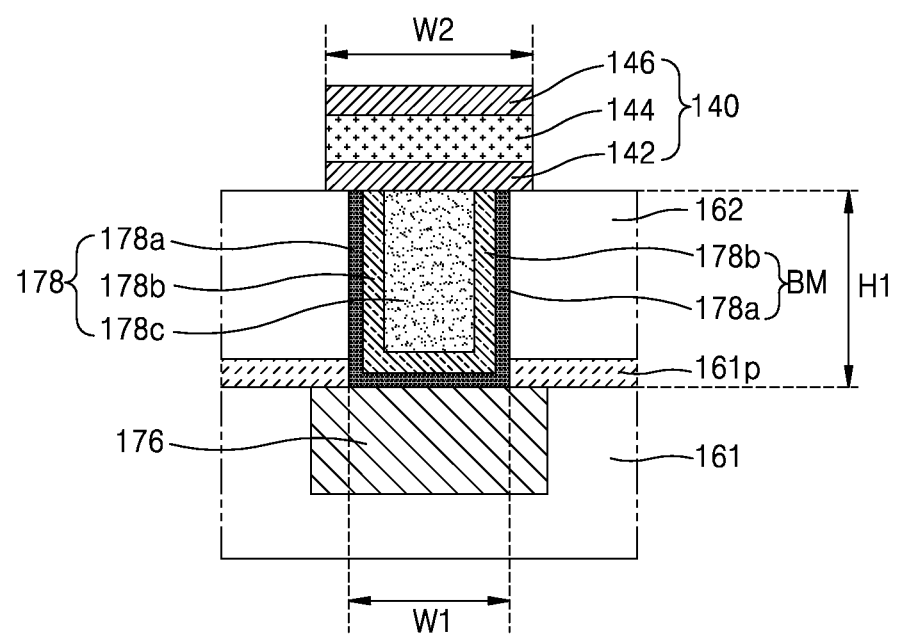

Referring to FIGS. 8D and 8E, a variable resistance structure material layer 140p is formed on the contact plug 178 and the second interlayer insulating layer 162, as illustrated in FIG. 8D. The variable resistance structure material layer 140p may include a lower electrode material layer 142p, a variable resistance material layer 144p, and an upper electrode material layer 146p.

As illustrated in FIG. 8E, a variable resistance structure 140 is formed by selectively etching the variable resistance structure material layer 140p using photolithography. As descried above, when the second width W2 of the variable resistance structure 140 is greater than the first width W1 of the contact plug 178, the variable resistance structure 140 may be easily formed without damage to the contact plug 178.

Figure 9:
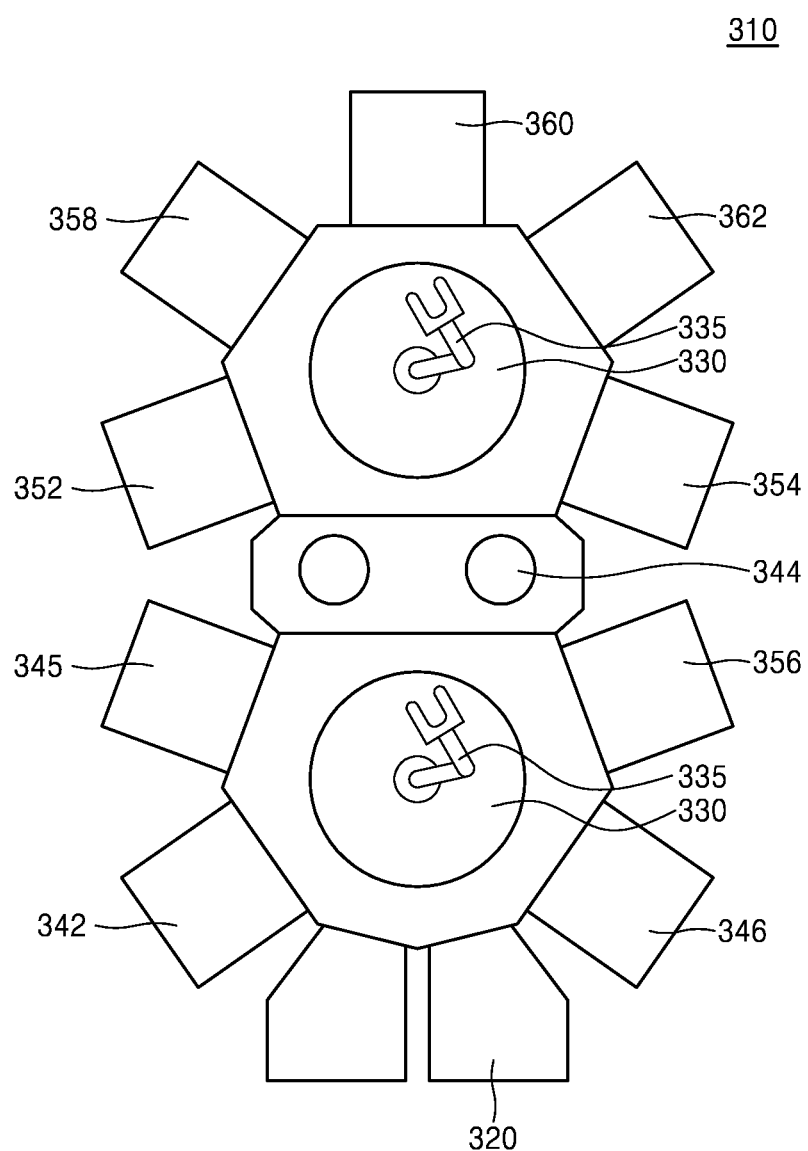
FIG. 9 is a view of a cluster deposition device for forming a barrier metal layer of the variable resistance memory device according to inventive concepts.

FIG. 9 is a view of a cluster deposition device for forming a barrier metal layer of the variable resistance memory device according to inventive concepts.

In detail, a cluster deposition device 310 may include a loadlock chamber 320, a transfer chamber 330, and various types of chambers. The transfer chamber 330 may include a wafer transfer device for transferring a wafer (or a substrate) positioned therein. The wafer transfer device may include a robot arm 335, and the robot arm 335 may carry the wafer into/out of the process chambers and the loadlock chamber 320.

The cluster deposition device 310 may include a cleaning chamber 345. The wafer carried out of the loadlock chamber 320 may be transferred to the cleaning chamber 345. The wafer may be cleaned in a cleaning chamber 345 using argon (Ar) or helium (He).

The cluster deposition device 310 may include degass chambers 342 and 346 and a cool down chamber 344. The degass chambers 342 and 346 may remove foreign substances from the surface of the wafer by supplying oxygen to the wafer. The cool down chamber 344 may lower a temperature that rises in a deposition process.

The cluster deposition device 310 may include deposition chambers 352, 354, 356, 358, 360, and 362. In the deposition chambers 352, 354, 356, 358, 360, and 362, a thin layer may be formed on the wafer using PVD, CVD, or ALD.

For example, the deposition chamber 360 may be a chamber in which a first barrier metal layer described above is to be deposited. The deposition chamber 356 may be a chamber in which a second barrier metal layer is to be deposited. The deposition chamber 352 may be a chamber in which a plug metal layer is to be deposited. The deposition chamber 362 may be a chamber in which a metal interconnection layer is to be formed. In this way, in the cluster deposition device 310, various types of material layers may be in-situ formed on the wafer (not shown) without vacuum brake.

Figure 10:
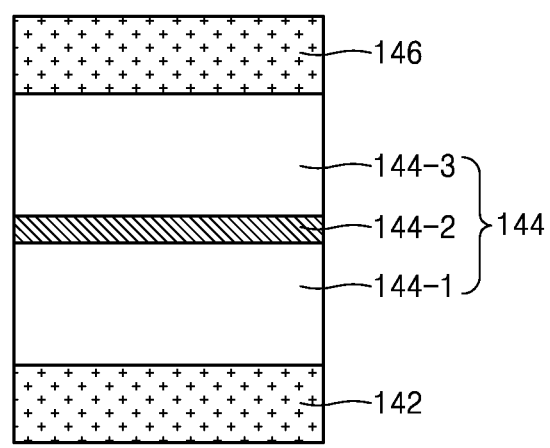
FIG. 10 is a cross-sectional view of an example structure of the variable resistance structure illustrated in FIGS. 5A through 5D.

FIG. 10 is a cross-sectional view of an example structure of the variable resistance structure illustrated in FIGS. 5A through 5D.

In detail, the variable resistance structure 140 may include a lower electrode 142, an upper electrode 146, and a variable resistance layer 144 including a first magnetization layer 144-1, a tunnel barrier layer 144-2, and a second magnetization layer 144-3, which are sequentially stacked between the lower electrode 142 and the upper electrode 146. One of the first magnetization layer 144-1 and the second magnetization layer 144-3 may include a pinned layer, and the other one thereof may include a free layer. However, embodiments are not limited thereto.

For example, the first magnetization layer 144-1 or the second magnetization layer 144-3 may include at least one pinned layer and at least one free layer. Also, in FIG. 10, the first magnetization layer 144-1 or the second magnetization layer 144-3 includes one tunnel barrier layer 144-2. However, embodiments are not limited thereto. A plurality of tunnel barrier layers may be included between the lower electrode 142 and the upper electrode 146.

A magnetization direction of the pinned layer may be fixed with a magnetization easy axis perpendicular to a surface of the pinned layer. The magnetization direction of the free layer with the magnetization easy axis perpendicular to the surface of the pinned layer may be variable according to conditions.

A resistance value of magnetic tunnel junction of the variable resistance structure 140 may be varied according to a magnetization direction of each of the first magnetization layer 144-1 and the second magnetization layer 144-3. For example, when magnetization directions of the first magnetization layer 144-1 and the second magnetization layer 144-3 are anti-parallel to each other, the variable resistance structure 140 may have a relatively high resistance value and may store '1' data. When the magnetization directions of the first magnetization layer 144-1 and the second magnetization layer 144-3 are parallel to each other, the variable resistance structure 140 may have a relatively low resistance value and may store '0' data. Data may be recorded/read on/from the variable resistance memory device 100 using a difference between the resistance values.

In some embodiments, the variable resistance structure 140 may be used to implement a perpendicular magnetization-type MTJ device. In some embodiments, the magnetization direction of the free layer of the variable resistance structure 140 may be changed by a spin transfer torque (STT). In some embodiments, the variable resistance structure 140 may have a horizontal MTJ structure in which a current movement direction and a magnetization easy axis are substantially perpendicular to each other.

The lower electrode 142 and the upper electrode 146 may include conductive materials having comparatively low reactivity. In some embodiments, the lower electrode 142 and the upper electrode 146 may include conductive metal nitrides. For example, the lower electrode 142 and the upper electrode 146 may have a single-layer structure including at least one material selected from the group consisting of Ti, Ta, ruthenium (Ru), TiN, TaN, and W, or a multi-layer structure including a plurality of materials.

The tunnel barrier layer 144-2 may have a smaller thickness than a spin diffusion distance. The tunnel barrier layer 144-2 may include a non-magnetic material. In some embodiments, the tunnel barrier layer 144-2 may include an oxide of at least one material selected from the group consisting of magnesium (Mg), Ti, aluminum (Al), magnesium-zinc (MgZn), and magnesium-boron (MgB). In some embodiments, the tunnel barrier layer 144-2 may include a Ti nitride or a vanadium (V) nitride.

In some embodiments, at least one of the first magnetization layer 144-1 and the second magnetization layer 144-3 may include at least one selected from the group consisting of iron (Fe), cobalt (Co), nickel (Ni), palladium (Pd), and platinum (Pt). In some embodiments, at least one of the first magnetization layer 144-1 and the second magnetization layer 144-3 may include a Co-M1 alloy (where M1 is at least one metal selected from the group consisting of Pt, Pd, and Ni), or an Fe-M2 alloy (where M2 is at least one metal selected from the group consisting of Pt, Pd, and Ni). In some embodiments, at least one of the first magnetization layer 144-1 and the second magnetization layer 144-3 may further include at least one material selected from the group consisting of boron (B), carbon (C), Cu, silver (Ag), gold (Au), Ru, Ta, and chromium (Cr).

In some embodiments, at least one of the first magnetization layer 144-1 and the second magnetization layer 144-3 may include a perpendicular magnetic anisotropy (PMA) material. In some embodiments, at least one of the first magnetization layer 144-1 and the second magnetization layer 144-3 may have a synthetic anti-ferromagnet (SAF) structure. The SAF structure is a structure in which a Ru intermediate layer is inserted into a ferromagnetic stack structure. For example, the SAF structure may have a multi-layer structure of CoFeB/Ta/(Co/Pt)m/Ru/(Co/Pd)n (where m and n are natural numbers). The SAF structure that may be employed in a magnetic memory device according to inventive concepts, is not limited to the above example and may be modified in various ways.

According to one or more embodiments, the variable resistance structure 140 illustrated in FIGS. 5A through 5D may include a lower electrode 142, an upper electrode 146, and a variable resistance layer 144 between the lower electrode 142 and the upper electrode 146. The variable resistance layer 144 may include a phase-change material layer.

A resistance may be changed as the phase-change material layer is changed into a crystalline state or an amorphous state depending on current flowing between the lower electrode 142 and the upper electrode 146. In this case, the variable resistance memory device 100 may be used in a PRAM device. The lower electrode 142 is formed below the phase-change material layer and heats the phase-change material layer. Thus, phase transformation may occur in the phase-change material layer.

The lower electrode 142 may include a metal or a metal compound, such as a metal nitride or a metal silicon nitride. For example, the lower electrode 142 may include a metal, such as W, Al, Cu, Ta, Ti, molybdenum (Mo), niobium (Nb), or zirconium (Zr), a metal nitride thereof, or a metal silicon nitride thereof. These materials may be solely used or mixed with each other.

The phase-change material layer may be formed on the lower electrode 142, and a bottom surface of the phase-change material layer may have a shape and an area that are substantially the same as a top surface of the lower electrode 142. The phase-change material layer may include a chalcogenide-based material in which germanium (Ge), antimony (Sb) and/or tellurium (Te) are combined at a desired (and/or alternatively predetermined) ratio.

The phase-change material layer may include Ge, Sb, Te, and at least one type of impurity X. In the phase-change material layer, one or more impurities selected from the group consisting of Group III, Group IV, Group V, and Group VI may be added into a Ge—Sb—Te system. In example embodiments, the composition of the phase-change material layer may be indicated by $X_aGe_bSb_cTe_{1-(a+b+c)}$. The impurity X may be selected from the group consisting of B, C, nitrogen (N), oxygen (O), Al, silicon (Si), phosphor (P), and sulfur (S). The impurity X may be selected from among C, N, and O. unlike this, the impurity X may be bismuth (Bi). The upper electrode 146 is formed to be in contact with the phase-change material layer. The upper electrode 146 may include a material that is substantially the same as or similar to a material for forming the lower electrode 142.

According to some embodiments, the variable resistance structure 140 illustrated in FIGS. 5A through 5D may include a lower electrode 142, an upper electrode 146, and a variable resistance layer 144 between the lower electrode 142 and the upper electrode 146. The variable resistance layer 144 may include a material having electrical resistance that changes due to oxygen vacancy or oxygen migration. In this case, the variable resistance memory device 100 may be used in an ReRAM device.

The variable resistance layer 144 may include a perovskite-based material or a transition metal oxide. The perovskite-based material may include STO($SrTiO_3$), BTO ($BaTiO_3$), or PCMO($Pr_{1-x}Ca_xMnO_3$), for example. The transition metal oxide may include, for example, titanium oxide (TiOx), zirconium oxide (ZrOx), aluminum oxide (AlOx), hafnium oxide (HfOx), tantalum oxide (TaOx), niobium oxide (NbOx), cobalt oxide (CoOx), tungsten oxide (WOx), lanthanum oxide (LaOx), or zinc oxide (ZnOx). These materials may be solely used, or two or more materials thereof may be combined.

The variable resistance layer 144 may also have a structure in which a plurality of layers including the above-described materials are stacked. For example, the variable resistance layer 144 may have a structure in which a first hafnium oxide ($HfO_2$) layer, a second hafnium oxide (HfOx) layer and a zirconium oxide (ZrOx) layer are stacked. The variable resistance layer 144 may also have a structure in which a titanium aluminum oxide (TiAlOx) layer, a tantalum oxide (TaOx) layer and an aluminum oxide (AlOx) layer are stacked.

Hereinafter, the case where a variable resistance layer of a variable resistance memory device according to one or more embodiments of inventive concepts is a magnetic resistance device (or an MTJ device), will be described.

Figure 11:
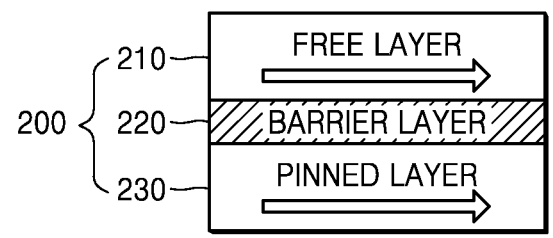
FIG. 11 is a cross-sectional view of a magnetic resistance device included in the variable resistance memory device, according to some embodiments of inventive concepts.

FIG. 11 is a cross-sectional view of a magnetic resistance device included in the variable resistance memory device, according to some embodiments of inventive concepts.

In detail, a magnetic resistance device 200 may include a free layer 210, a pinned layer 230, and a barrier layer 220 interposed between the free layer 210 and the pinned layer 230. The magnetic resistance device 200 may correspond to the cell memory MC of FIG. 3 described above.

The magnetization direction of the free layer 210 is variable with a magnetization easy axis perpendicular to a surface of the free layer 210 according to conditions. The magnetization direction of the pinned layer 230 is fixed with a magnetization easy axis perpendicular to a surface of the pinned layer 230. A resistance value of the magnetic resistance device 200 is changed according to the magnetization direction of the free layer 210.

When the magnetization direction of the free layer 210 and the magnetization direction of the pinned layer 230 are parallel to each other, the magnetic resistance device 200 may have a low resistance value and may store '0' data. When the magnetization direction of the free layer 210 and the magnetization direction of the pinned layer 230 are anti-parallel to each other, the magnetic resistance device 200 may have a high resistance value and may store '1' data.

In FIG. 11, positions of the pinned layer 230 and the free layer 210 are not limited to the example and may be switched to each other. Alternatively, data stored in the magnetic resistance device 200 may be opposite according to the magnetization direction of the free layer 210.

Each of the free layer 210 and the pinned layer 230 may have interface perpendicular magnetic anisotropy (IPMA) at an interface (i.e., a contact surface) with the barrier layer 220. To this end, the free layer 210 and the pinned layer 230 may include a ferromagnetic material. The ferromagnetic material may have comparatively high magnetic anisotropy energy Ku of about 106 to 107 erg/cc, for example. The free layer 210 and the pinned layer 230 may have a magnetization easy axis perpendicular to the interface due to high magnetic anisotropy energy.

The free layer 210 is a magnetic layer having a changeable magnetization direction. That is, the free layer 210 may include a ferromagnetic material having a magnetic moment in which a direction of magnetization is freely changed in a direction perpendicular to the surface of the free layer 210, for example, at least one from among Co, Fe, and Ni and may further include other elements, such as B, Cr, Pt, and Pd. The free layer 210 may be formed of a different material from a material for forming the pinned layer 230 or may also be formed of the same material as the material for forming the pinned layer 230.

The pinned layer 230 that is a magnetic layer having a fixed magnetization direction may include at least one ferromagnetic material from among Co, Fe, and Ni and may further include other elements, such as B, Cr, Pt, and Pd. The pinned layer 230 in the current embodiment is illustrated as one single layer. However, embodiments are not limited thereto, and the pinned layer 230 may have a multi-layer structure.

In some embodiments, the pinned layer 230 may have a multi-layer structure in which a first layer formed of at least one of Co and a Co alloy and a second layer formed of at least one from among Pt, Ni, and Pd are alternately stacked, or may include a FePt layer or a CoPt layer having a L10 structure, or an alloy layer of a rare-earth element and a transition metal. Here, the rare-earth element may be at least one of terbium (Tb) and gadolinium (Gd), and the transition metal may be at least one from among Ni, Fe, and Co. An alloy of various combinations of a rare-earth element and a transition metal may be used. Among them, for example, CoFeB or CoFe may be used as a material for forming the pinned layer 230.

The barrier layer 220 is interposed between the free layer 210 and the pinned layer 230 so as to increase a tunnel magnetoresistance ratio (TMR) of the magnetic resistance device 200. The barrier layer 220 may have a thickness of about 8 to 15 Å. The barrier layer 220 may have a smaller thickness than a spin diffusion distance. The barrier layer 220 may include a non-magnetic material. The barrier layer 220 may include at least one selected from the group consisting of magnesium (Mg), titanium (Ti), aluminum (Al), an oxide of MgZn and MgB, and a nitride of Ti and V. The barrier layer 220 may have a multi-layer structure, for example.

In some embodiments, the free layer 210, the barrier layer 220, and the pinned layer 230 may have the same crystalline structure. For example, each of the free layer 210, the barrier layer 220, and the pinned layer 230 may have a body centered cubic (BCC) crystalline structure.

Figure 12:
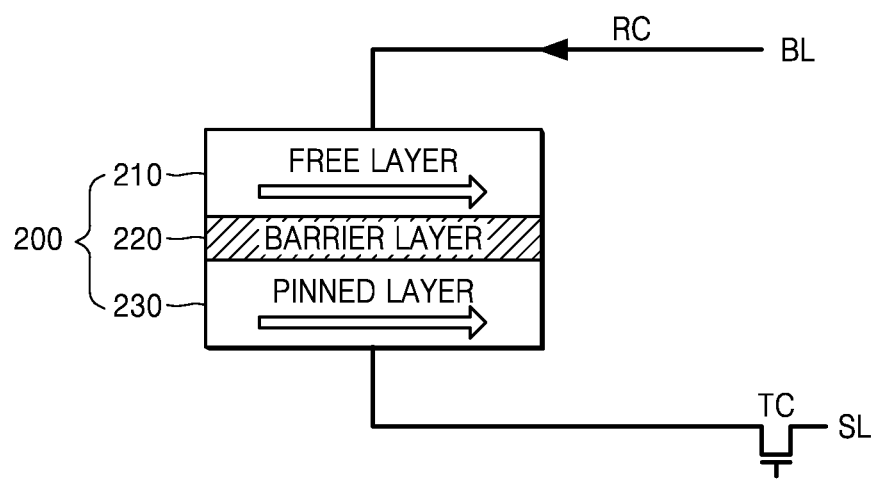
FIGS. 12 and 13 are views for explaining an operation of reading data written to the magnetic resistance device included in the variable resistance memory device, according to some embodiments of inventive concepts.
Figure 13:
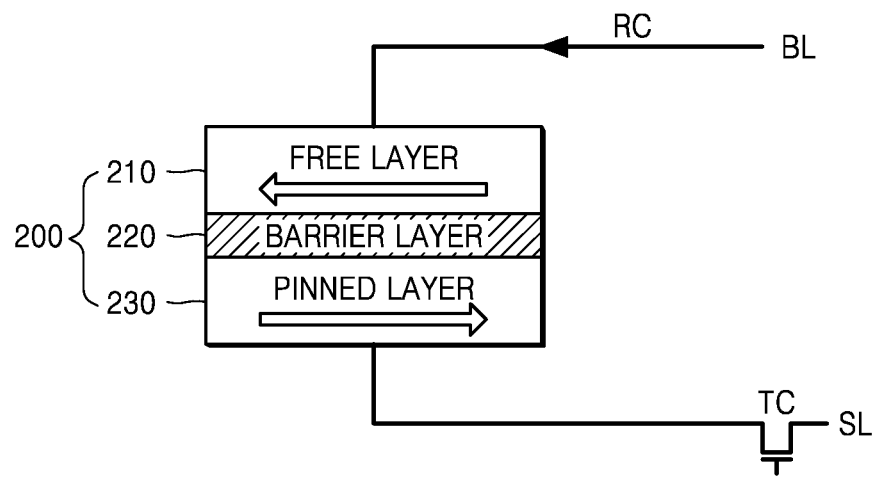

FIGS. 12 and 13 are views for explaining an operation of reading data written to the magnetic resistance device included in the variable resistance memory device, according to some embodiments of inventive concepts.

In detail, FIGS. 12 and 13 show a magnetization direction according to data written to the magnetic resistance device 200, respectively. A resistance value of the magnetic resistance device 200 varies according to the magnetization direction of the free layer 210. When a read current RC flows through the magnetic resistance device 200, a data voltage according to the resistance value of the magnetic resistance device 200 is output. Because an intensity of the read current RC is much smaller than the intensity of a write current, the magnetization direction of the free layer 210 is not changed by the read current RC.

Referring to FIG. 12, the magnetization direction of the free layer 210 and the magnetization direction of the pinned layer 230 in the magnetic resistance device 200 are parallel to each other. In this case, the magnetic resistance device 200 has a low resistance value. In this case, when the read current RC flows through the magnetic resistance device 200, "0" data may be read.

Referring to FIG. 13, in the magnetic resistance device 200, the magnetization direction of the free layer 210 and the magnetization direction of the pinned layer 230 are anti-parallel to each other. The magnetic resistance device 200 has a high resistance value. In this case, when the read current RC flows through the magnetic resistance device 200, "1" data may be read.

In the magnetic resistance device 200 shown in FIGS. 11-13, the free layer 210 and the pinned layer 230 are horizontal magnetic devices. However, according to other embodiments, the free layer 210 and the pinned layer 230 may also be perpendicular magnetic devices.

Figure 14:
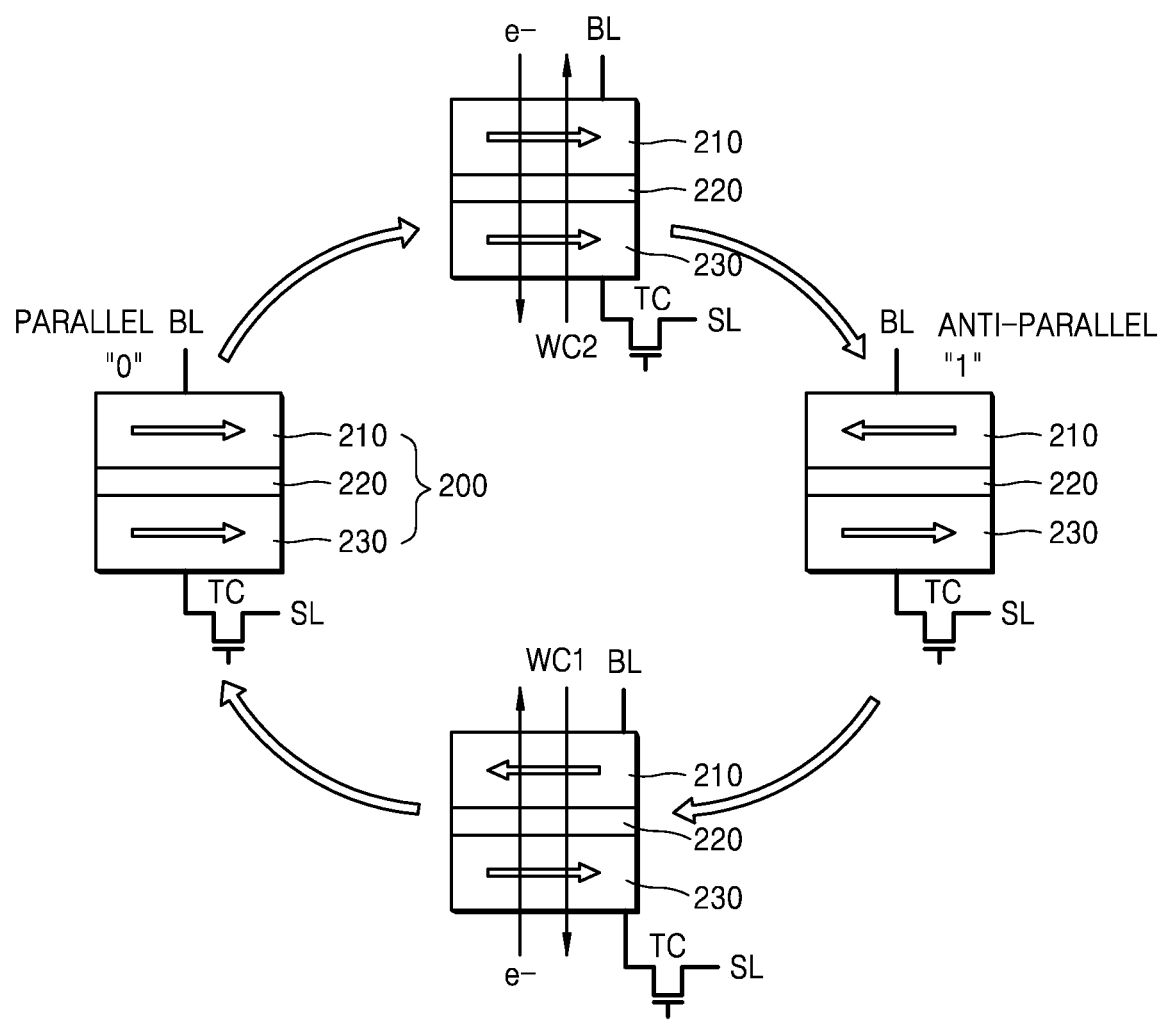
FIG. 14 is a view for explaining a write operation of the magnetic resistance device included in the variable resistance memory device, according to some embodiments of inventive concepts.

FIG. 14 is a view for explaining a write operation of the magnetic resistance device included in the variable resistance memory device according to some embodiments of inventive concepts.

In detail, the magnetization direction of the free layer 210 may be determined according to directions of write currents WC1 and WC2 that flow through the magnetic resistance device 200. For example, when a first write current WC1 is applied to the pinned layer 230 from the free layer 210, free electrons having the same spin direction as that of the pinned layer 230 apply a torque to the free layer 210. Thus, the free layer 210 is magnetized parallel to the pinned layer 230.

When a second write current WC2 is applied to the free layer 210 from the pinned layer 230, electrons having an opposite spin direction to that of the pinned layer 230 return to the free layer 210 and apply a torque to the pinned layer 230. Thus, the free layer 210 is magnetized anti-parallel to the pinned layer 230. That is, the magnetization direction of the free layer 210 in the magnetic resistance device 200 may be changed by a STT.

As described above, in a variable resistance memory device according to the technical spirit of inventive concepts, a metal interconnection layer can be electrically connected to a variable resistance structure using a contact plug including a plurality of barrier metal layers and a plug metal layer.

The plurality of barrier metal layers may be used to easily connect the metal interconnection layer to the plug metal layer. In other words, a first barrier metal layer formed on the metal interconnection layer serves as an elution-preventing layer for limiting and/or preventing elution of the metal interconnection layer or a diffusion-preventing layer for limiting and/or preventing diffusion of the metal interconnection layer. A second barrier metal layer formed on the first barrier metal layer may be a coupling enhancement layer for enhancing coupling with the plug metal layer or a reaction-preventing layer for limiting and/or preventing a reaction with the metal interconnection layer.

While inventive concepts has been particularly shown and described with reference to embodiments thereof, it will be understood that various changes in form and details may be made therein without departing from the spirit and scope of the following claims.

What is claimed is:

1. A variable resistance memory device comprising:
a substrate;
a metal interconnection layer on the substrate;
an interlayer insulating layer on the metal interconnection layer such that the metal interconnection layer is between the substrate and the interlayer insulating layer, the interlayer insulating layer defining a contact hole over the metal interconnection layer for exposing a portion of the metal interconnection layer;
a barrier metal layer including a plurality of sub-barrier metal layers inside the contact hole;
a plug metal layer, on the barrier metal layer, the plug metal layer burying the contact hole; and
a variable resistance structure on the barrier metal layer and the plug metal layer,
wherein
the plurality of sub-barrier metal layers include a first sub-barrier metal layer and a second sub-barrier metal layer,
the first sub-barrier metal layer is in the contact hole and on top of the metal interconnection layer,
the second sub-barrier metal layer is on the first sub-barrier metal layer, and the second sub-barrier metal layer is under the plug metal layer, and
wherein
the first sub-barrier metal layer includes an elution-preventing layer for limiting elution of the metal interconnection layer or a diffusion-preventing layer for limiting diffusion of the metal interconnection layer.

2. The variable resistance memory device of claim 1, wherein
the first sub-barrier metal layer covers a bottom of the contact hole and covers an inner wall of the contact hole, and
the plug metal layer is on top of the second sub-barrier metal layer so as to bury the contact hole.

3. The variable resistance memory device of claim 1, wherein
the first sub-barrier metal layer includes an amorphous layer, and
the second sub-barrier metal layer includes a crystalline layer.

4. The variable resistance memory device of claim 1, wherein
the second sub-barrier metal layer includes a coupling enhancement layer for enhancing coupling with the plug metal layer or a reaction-preventing layer for limiting a reaction with the metal interconnection layer.

5. The variable resistance memory device of claim 1, wherein
the metal interconnection layer includes a copper (Cu) layer,
the first sub-barrier metal layer comprises a tungsten nitride (WN) layer or a tantalum nitride (TaN) layer, and
the second sub-barrier metal layer includes a titanium nitride (TiN) layer.

6. The variable resistance memory device of claim 1, wherein
the variable resistance structure includes a magnetic tunnel junction (MTJ) device or a magnetic resistance device.

7. The variable resistance memory device of claim 1, wherein
the barrier metal layer and the plug metal layer form a contact plug, and the contact plug is configured to electrically connect the metal interconnection layer to the variable resistance structure.

8. A variable resistance memory device comprising:
a substrate;
a metal interconnection layer on the substrate;
interlayer insulating layer on the metal interconnection layer such that the metal interconnection layer is between the substrate and the interlayer insulating layer, the interlayer insulating layer defining a contact hole over the metal interconnection layer for exposing a portion of the metal interconnection layer;
a first barrier metal layer on the metal interconnection layer, the first barrier metal layer covering a bottom of the contact hole and covering an inner wall of the contact hole;
a second barrier metal layer on the first barrier metal layer;
a plug metal layer on the second barrier metal layer, the plug metal layer burying the contact hole, the plug metal layer, the first barrier metal layer, and the second barrier metal layer forming a contact plug having a first width; and
a variable resistance structure on the first barrier metal layer, the second barrier metal layer, and the plug metal layer,
the variable resistance structure having a second width,
wherein the first barrier metal layer includes an elution-preventing layer for limiting elution of the metal interconnection layer or a diffusion-preventing layer for limiting diffusion of the metal interconnection layer.

9. The variable resistance memory device of claim 8, wherein
the variable resistance structure is on top of the interlayer insulating layer, and
the second width of the variable resistance structure is greater than the first width of the contact plug.

10. The variable resistance memory device of claim 8, wherein the second width of the variable resistance structure is equal to the first width of the contact plug.

11. The variable resistance memory device of claim 8, wherein
the first barrier metal layer includes an amorphous layer, and
the second barrier metal layer includes a crystalline layer.

12. The variable resistance memory device of claim 8, wherein the second barrier metal layer includes a coupling enhancement layer for enhancing coupling with the plug metal layer or a reaction-preventing layer for limiting a reaction with the metal interconnection layer.

13. The variable resistance memory device of claim 8, wherein
the metal interconnection layer includes a copper (Cu) layer,
the first barrier metal layer includes a tungsten nitride (WN) layer or a tantalum nitride (TaN) layer, and
the second barrier metal layer includes a titanium nitride (TiN) layer.

14. A variable resistance memory device comprising:
a plurality of word lines arranged parallel to one another along a first direction, the plurality of word lines spaced apart from one another;
a plurality of source lines arranged parallel to one another along a second direction that is perpendicular to the first direction, the plurality of source lines spaced apart from one another;
a metal interconnection layer;
a contact plug including a plurality of barrier metal layers;
a plurality of bit lines on the plurality of source lines and parallel to one another along the second direction, the plurality of bit lines spaced apart from one another; and
a plurality of memory cells connected between the plurality of source lines and the plurality of bit lines,
each of the plurality of memory cells includes a variable resistance structure that, includes a variable resistance layer and a cell transistor,
the cell transistor includes a source and a drain,
the source or the drain of the cell transistor in a corresponding one of the plurality or memory cells is connected to the metal interconnection layer, and
the variable resistance structure is connected to the metal interconnection layer via the contact plug including the plurality of barrier metal layers, the contact plug being between the variable resistance structure and the metal interconnection layer.

15. The variable resistance memory device of claim 14, further comprising:
a plug metal layer on the plurality of barrier metal layers, wherein
the contact plug directly contacts the metal interconnection layer and the plug metal layer on the plurality of barrier metal layers, and
the contact plug directly contacts the variable resistance structure.

16. The variable resistance memory device of claim 15, wherein
the plurality of barrier metal layers include a first barrier metal layer and a second barrier metal layer,
the first barrier metal layer directly contacts the metal interconnection layer, and
the second barrier metal layer directly contacts with plug metal layer on the first barrier metal layer.

17. The variable resistance memory device of claim 14, wherein
the variable resistance layer includes a magnetic tunnel junction (MTJ) device or a magnetic resistance device.

18. The variable resistance memory device of claim 14, wherein
the plurality of barrier metal layers include a first barrier metal layer and a second barrier metal layer, and
the first barrier metal layer includes an elution-preventing layer for limiting elution of the metal interconnection layer or a diffusion-preventing layer for limiting diffusion of the metal interconnection layer.

19. The variable resistance memory device of claim 18, wherein
the second barrier metal layer includes a coupling enhancement layer for enhancing coupling with the contact plug or a reaction-preventing layer for limiting a reaction with the metal interconnection layer.

* * * * *